United States Patent
Liu et al.

(10) Patent No.: US 9,385,201 B2
(45) Date of Patent: Jul. 5, 2016

(54) BURIED SOURCE-DRAIN CONTACT FOR INTEGRATED CIRCUIT TRANSISTOR DEVICES AND METHOD OF MAKING SAME

(71) Applicants: STMicroelectronics, Inc., Coppell, TX (US); GlobalFoundries Inc, Grand Cayman (KY); International Business Machines Corporation, Armonk, NY (US)

(72) Inventors: Qing Liu, Watervliet, NY (US); Ruilong Xie, Schenectady, NY (US); Chun-Chen Yeh, Clifton Park, NY (US); Xiuyu Cai, Niskayuna, NY (US); William J. Taylor, Clifton Park, NY (US)

(73) Assignees: STMICROELECTRONICS, INC., Coppell, TX (US); GLOBALFOUNDRIES INC, Grand Cayman (KY); INTERNATIONAL BUSINESS MACHINES CORPORATION, Armonk, NY (US)

( * ) Notice: Subject to any disclaimer, the term of this patent is extended or adjusted under 35 U.S.C. 154(b) by 11 days.

(21) Appl. No.: 14/297,822

(22) Filed: Jun. 6, 2014

(65) Prior Publication Data

US 2015/0357425 A1    Dec. 10, 2015

(51) Int. Cl.
  *H01L 21/84*    (2006.01)
  *H01L 29/417*   (2006.01)
  *H01L 29/78*    (2006.01)
  *H01L 29/66*    (2006.01)

(52) U.S. Cl.
  CPC .... *H01L 29/41791* (2013.01); *H01L 29/66795* (2013.01); *H01L 29/785* (2013.01)

(58) Field of Classification Search
  None
  See application file for complete search history.

(56) References Cited

U.S. PATENT DOCUMENTS

| | | | | |
|---|---|---|---|---|
| 7,402,866 B2* | 7/2008 | Liang | ............. | H01L 21/84 257/347 |
| 7,646,046 B2* | 1/2010 | Russ | ............. | H01L 29/458 257/288 |
| 8,105,887 B2* | 1/2012 | Luo | ............. | H01L 21/823807 257/E21.431 |
| 8,110,877 B2 | 2/2012 | Mukherjee et al. | | |
| 8,617,973 B2 | 12/2013 | Xie et al. | | |
| 8,679,909 B2 | 3/2014 | Xie et al. | | |
| 2007/0029611 A1 | 2/2007 | Phan et al. | | |
| 2010/0019385 A1 | 1/2010 | Bartley et al. | | |
| 2011/0260248 A1* | 10/2011 | Smeys | ............. | H01L 21/76898 257/347 |

* cited by examiner

*Primary Examiner* — Benjamin Sandvik
*Assistant Examiner* — Herve Assouman
(74) *Attorney, Agent, or Firm* — Gardere Wynne Sewell LLP

(57) ABSTRACT

An integrated circuit transistor is formed on a substrate. A trench in the substrate is at least partially filed with a metal material to form a source (or drain) contact buried in the substrate. The substrate further includes a source (or drain) region in the substrate which is in electrical connection with the source (or drain) contact. The substrate further includes a channel region adjacent to the source (or drain) region. A gate dielectric is provided on top of the channel region and a gate electrode is provided on top of the gate dielectric. The substrate may be of the silicon on insulator (SOI) or bulk type. The buried source (or drain) contact makes electrical connection to a side of the source (or drain) region using a junction provided at a same level of the substrate as the source (or drain) and channel regions.

36 Claims, 33 Drawing Sheets

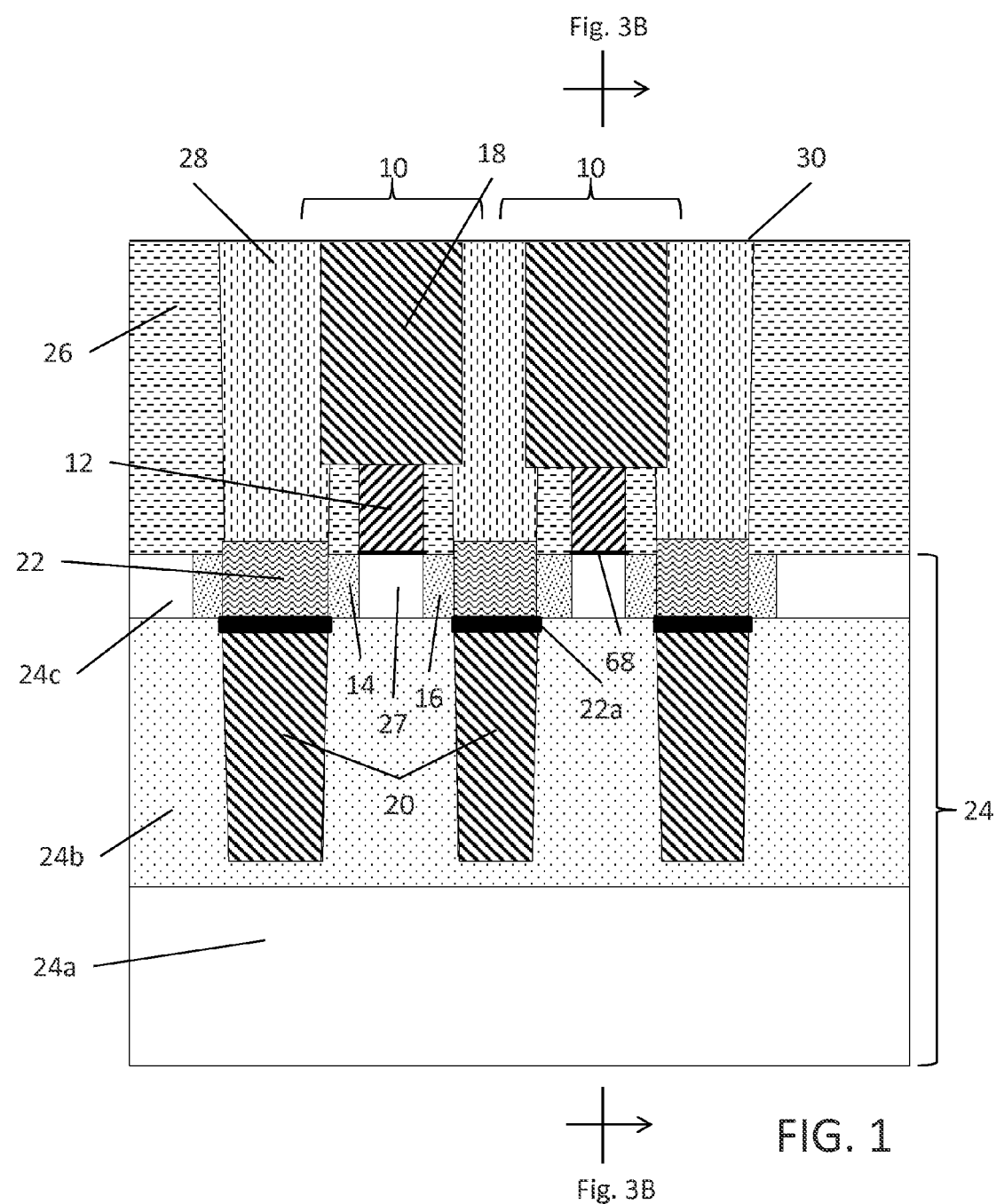

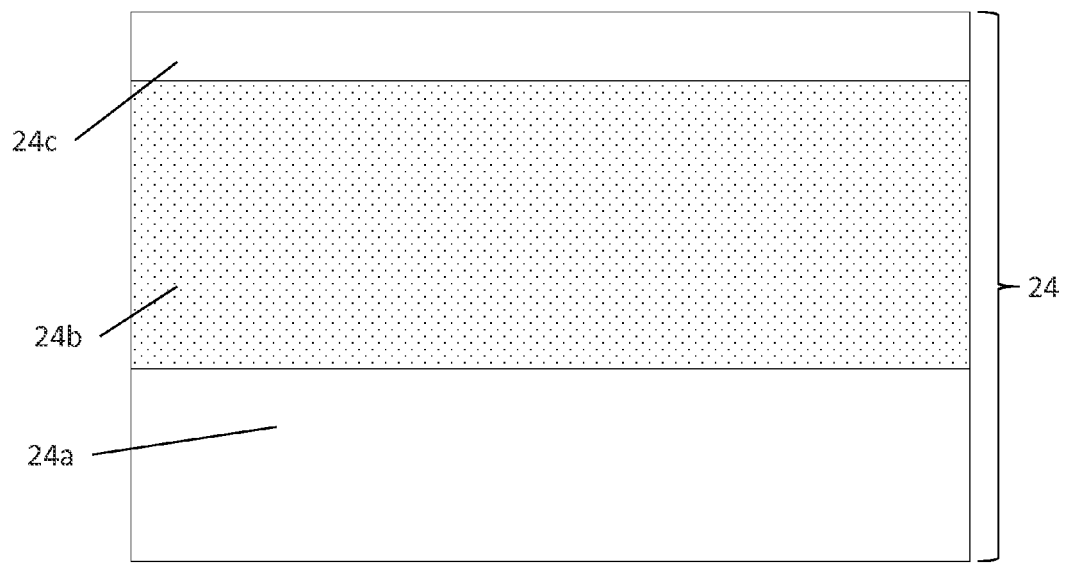
FIG. 2A
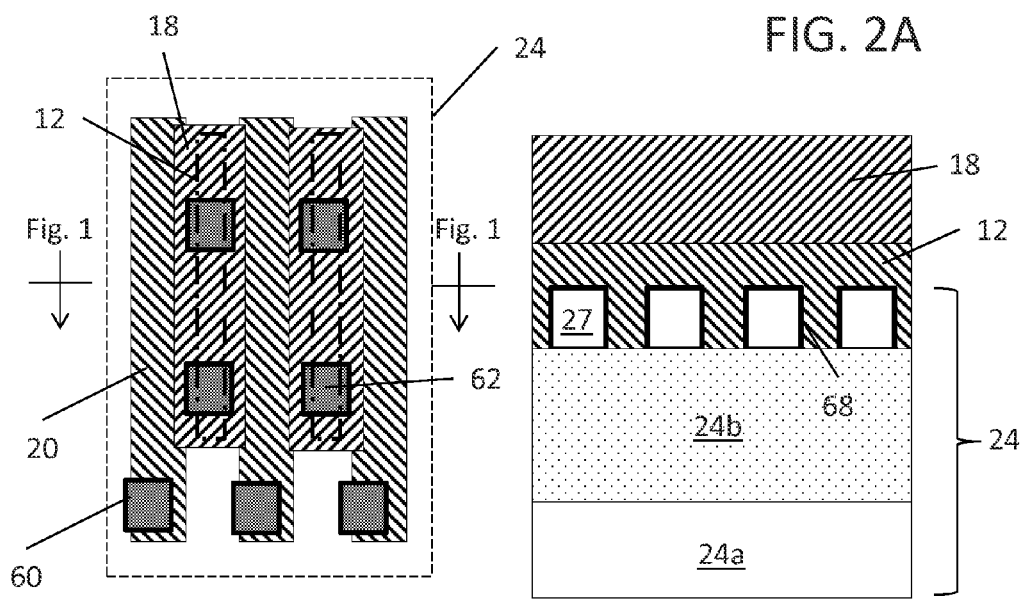
FIG. 3A
FIG. 3B

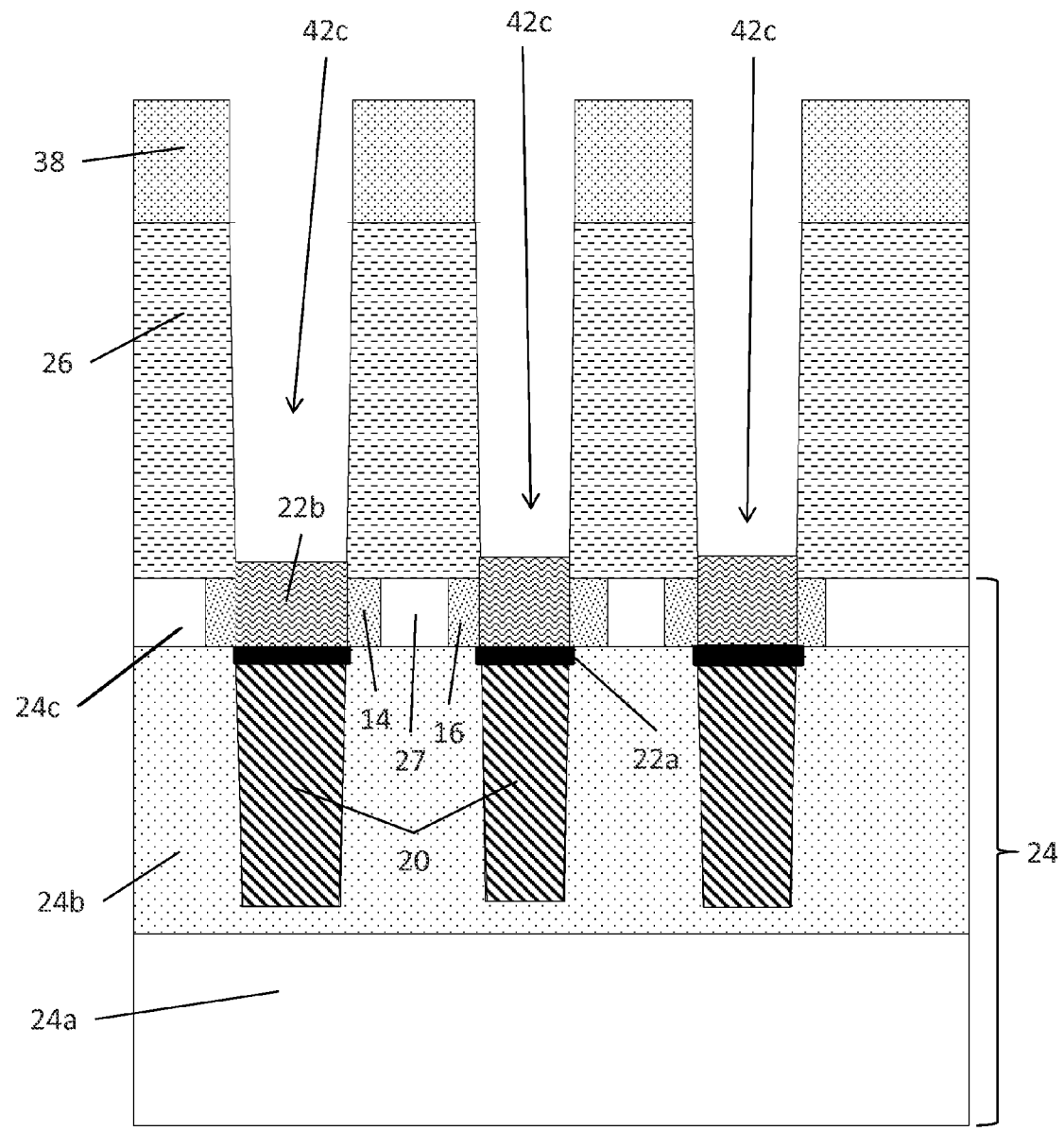
FIG. 2F1

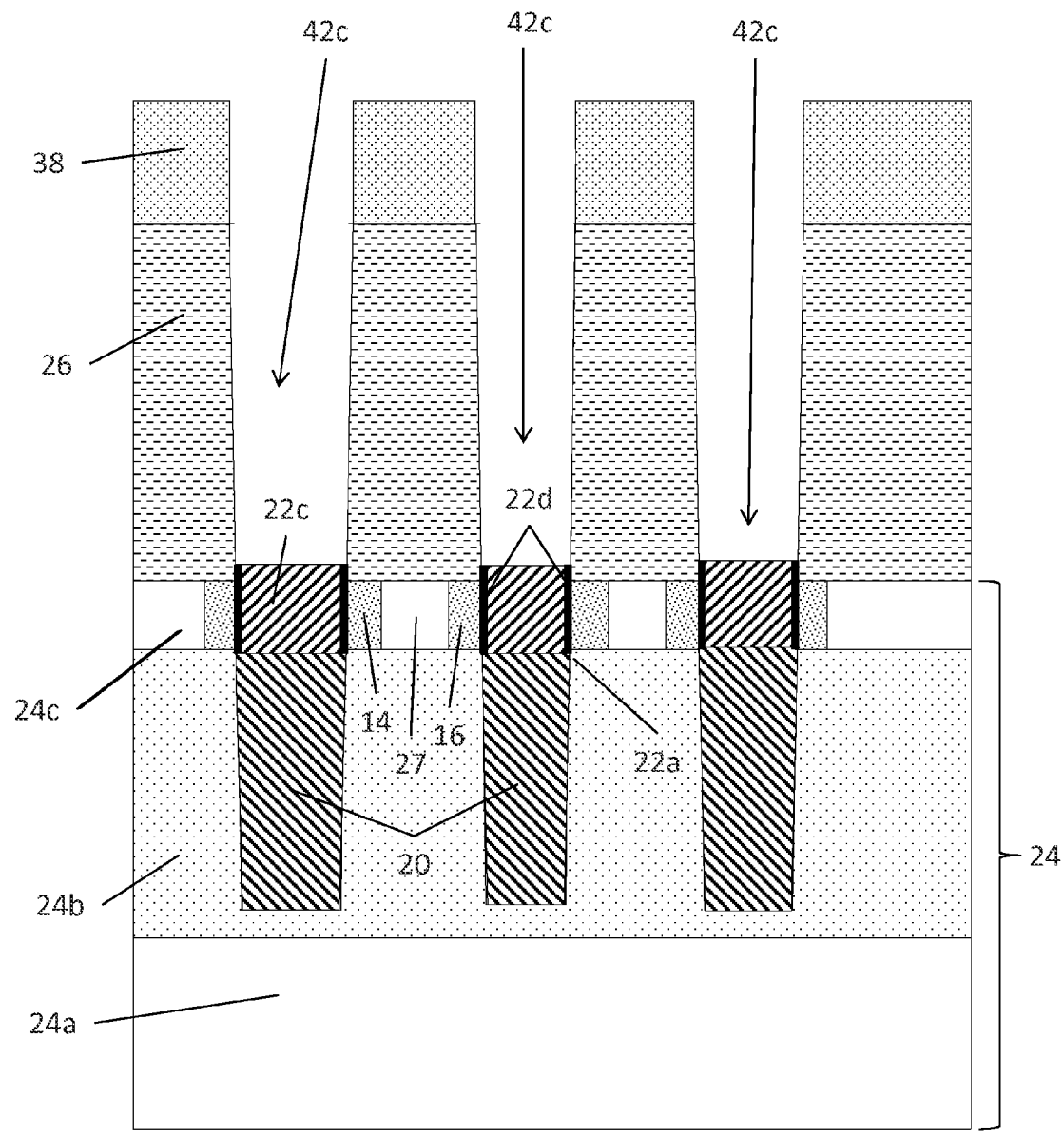
FIG. 2F2

BURIED SOURCE-DRAIN CONTACT FOR INTEGRATED CIRCUIT TRANSISTOR DEVICES AND METHOD OF MAKING SAME

FIELD OF THE INVENTION

The present disclosure generally relates to integrated circuits and, in particular, to integrated circuits with transistors formed with a small pitch.

BACKGROUND

Those skilled in the art understand that integrated circuit dimensions are becoming increasingly smaller. Indeed, there is a desire to produce integrated circuit devices, such as transistors, which exhibit a pitch scaling <100 nm and still further <50 nm. As the pitch scaling continues to decrease, it becomes increasingly more difficult to make electrical contact to transistor source, drain and gate regions from above the transistor (as is commonly done in the prior art). The dimensions of the gate contact, made from above the transistor, may exceed the length dimension of the transistor and extend above the source region and drain region. Such extension can effectively block access to the source and drain regions from above the transistor.

There is accordingly a need in the art for an alternatively means to make electrical contact to transistor source and drain regions in instances of increasingly smaller transistor pitch scaling.

SUMMARY

In an embodiment, an integrated circuit transistor comprises: a substrate including a trench; a metal material at least partially filling the trench to form a source contact buried in the substrate; a source region in the substrate in electrical connection with the source contact; a channel region in the substrate adjacent the source region; a gate dielectric on top of the channel region; and a gate electrode on top of the gate dielectric.

In an embodiment, a method comprises: forming a trench in a substrate; at least partially filing said trench with a metal material form a source contact buried in the substrate but exposing a side wall of the substrate; doping the exposed side wall of the substrate to define a source region adjacent a channel region; providing a gate dielectric on top of the channel region; and forming a gate electrode on the gate dielectric.

The foregoing and other features and advantages of the present disclosure will become further apparent from the following detailed description of the embodiments, read in conjunction with the accompanying drawings. The detailed description and drawings are merely illustrative of the disclosure, rather than limiting the scope of the invention as defined by the appended claims and equivalents thereof.

BRIEF DESCRIPTION OF DRAWINGS

Embodiments are illustrated by way of example in the accompanying figures not necessarily drawn to scale, in which like numbers indicate similar parts, and in which:

FIG. 1 is a cross-sectional diagram of a plurality of transistors which utilize a buried contact made to the transistor source-drain regions;

FIGS. 2A-2M illustrate process steps for forming the integrated circuit shown in FIG. 1;

FIG. 3A is a plan view of the integrated circuit shown in FIG. 1;

FIG. 3B is a cross-sectional view of the integrated circuit shown in FIG. 1;

DETAILED DESCRIPTION OF THE DRAWINGS

Figure 2B:
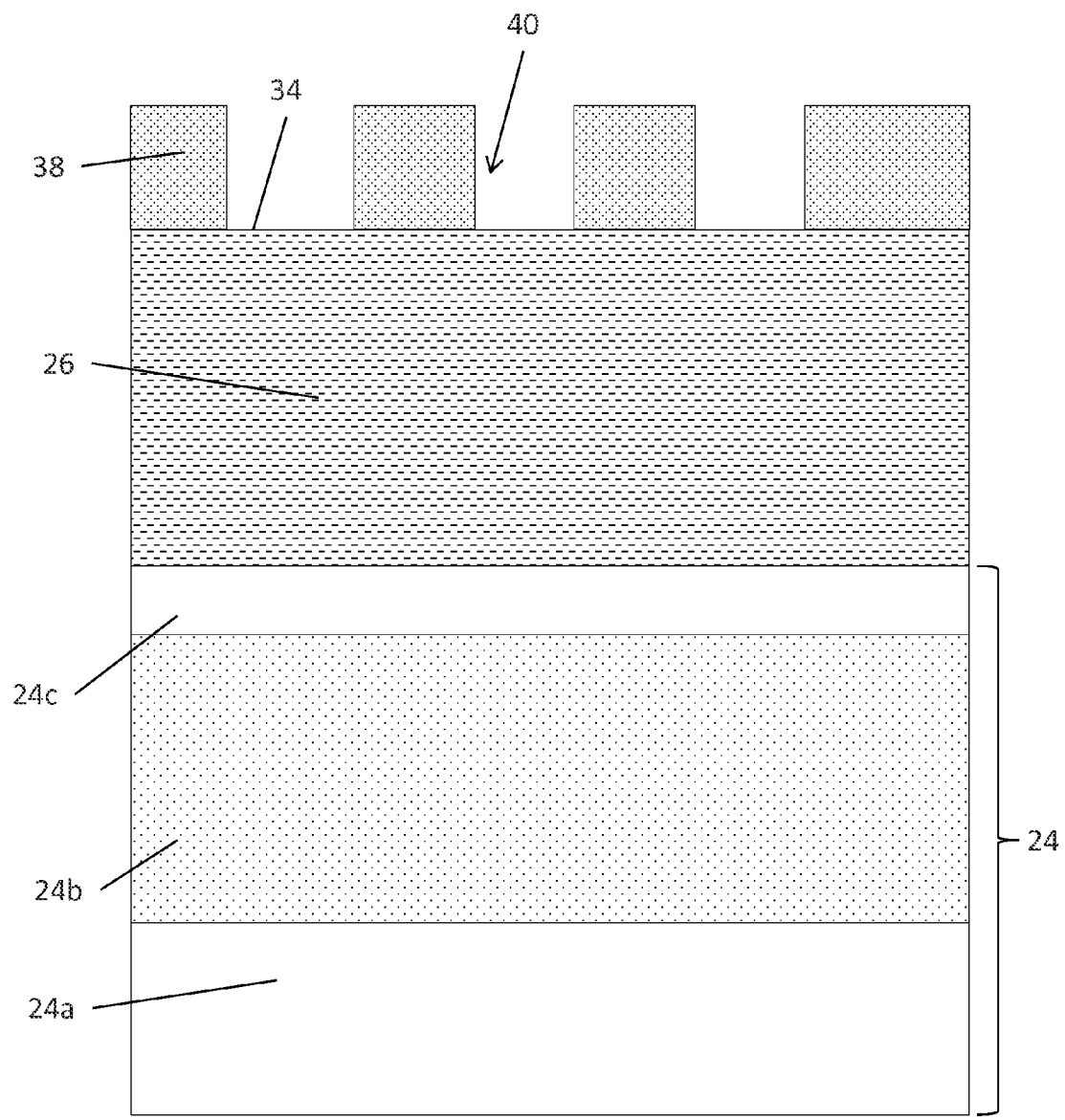

Reference is now made to FIG. 1 which illustrates a cross-sectional diagram of a plurality of transistors utilizing a buried contact made to the transistor source-drain regions. Each transistor 10 includes a gate region 12, a source region 14 and a drain region 16. A gate contact 18 extends from above the transistor to make electrical contact to the gate region 12. A source-drain contact 20 extends from below the transistor to make electrical contact to the source region 14 and/or drain region 16 through a junction 22. The transistors 10 are formed on and in a substrate 24. In the illustrated embodiment of FIG. 1, the substrate 24 comprises a silicon on insulator (SOI) substrate including a silicon layer 24a, an insulator layer 24b and a silicon layer 24c which are stacked on top of each other in a manner well known to those skilled in the art. The silicon layer 24c may, for example, be of the fully depleted type.

It will be noted that the gate contact 18 is larger than the length of the transistor 10 (said length defined by the size of the gate region 12 and a channel region 27 provided in the silicon layer 24c). The source region 14 and drain region 16 are also provided in the silicon layer 24c on either side of the channel region 27, but at least part of each of the source region 14 and drain region 16 is located vertically underneath the gate contact 18 due to the relatively small pitch scaling of the transistors 10. This makes it difficult to place the source-drain contacts in the manner taught by the prior art to reach the source region 14 and drain region 16 from above the transistor in a manner similar to that provided by the gate contact 18. The transistors 10 instead utilize source-drain contacts 20 which extend from below the transistor to make electrical contact to the source region 14 and/or drain region 16. The junction 22 is formed at the same level as the silicon layer 24c in order to provide an electrical interconnection of the source-drain contact 20 to the source region 14 and/or drain region 16. The junction 22 includes a silicide contact 22a at the top of the gate contact 18 in order to ensure a good electrical connection of low resistivity. The gate contact 18 extends through insulating materials 26 and 28 to reach the gate region 12. These insulating materials form the pre-metal dielectric region as known to those skilled in the art. The top surface of the insulating materials, along with the top surface of the gate contact 18, is planarized to provide a co-planar surface 30 configured to support further back end of line (BEOL) fabrication (such as the addition of metallization layers and pads) known to those skilled in the art.

Reference is now made to FIGS. 2A-2M which illustrate process steps for forming the integrated circuit shown in FIG. 1.

FIG. 2A shows the starting silicon on insulator (SOI) substrate 24 (provided in a wafer format) including a base substrate layer 24a (for example, formed of silicon), an insulator layer 24*b* and a semiconductor layer 24*c* (for example, made of silicon or silicon germanium). The semiconductor layer 24*c* is preferably patterned in the shape of a fin structure as known to those skilled in the art and familiar with the fabrication of FINFET-type transistors (see, FIG. 3B). The layers of substrate 24 are stacked with the insulator layer 24*b* positioned in contact with and between the base substrate layer 24*a* and the semiconductor layer 24*c*. The semiconductor layer 24*c* may be doped if desired or alternatively may be fully depleted.

FIG. 2B illustrates the deposition of an insulating material 26 over the wafer on a top surface of the substrate 24. If the semiconductor layer 24*c* has been patterned to form fins, the insulating material 26 will fill areas between adjacent fins (not explicitly shown) and reach down to the insulator layer 24*b*. In a preferred implementation, the insulating material 26 comprises a low-k dielectric material, for example, made of silicon nitride (SiN). The deposit of insulating material 26 is conformal, and thus a top surface of the material as deposited may not be planar. In such a case, a chemical-mechanical polishing (CMP) operation is performed to provide a planar top surface 34. A patterned mask 38 is then formed on the planar top surface 34, the mask 38 including a number of openings 40 which correspond to the locations where source-drain contacts 20 (see, FIG. 1) are to be formed. The material used for the patterned mask 38 may, for example, comprise a-Si material patterned using a lithographic etch in a manner well known to those skilled in the art.

Figure 2C:
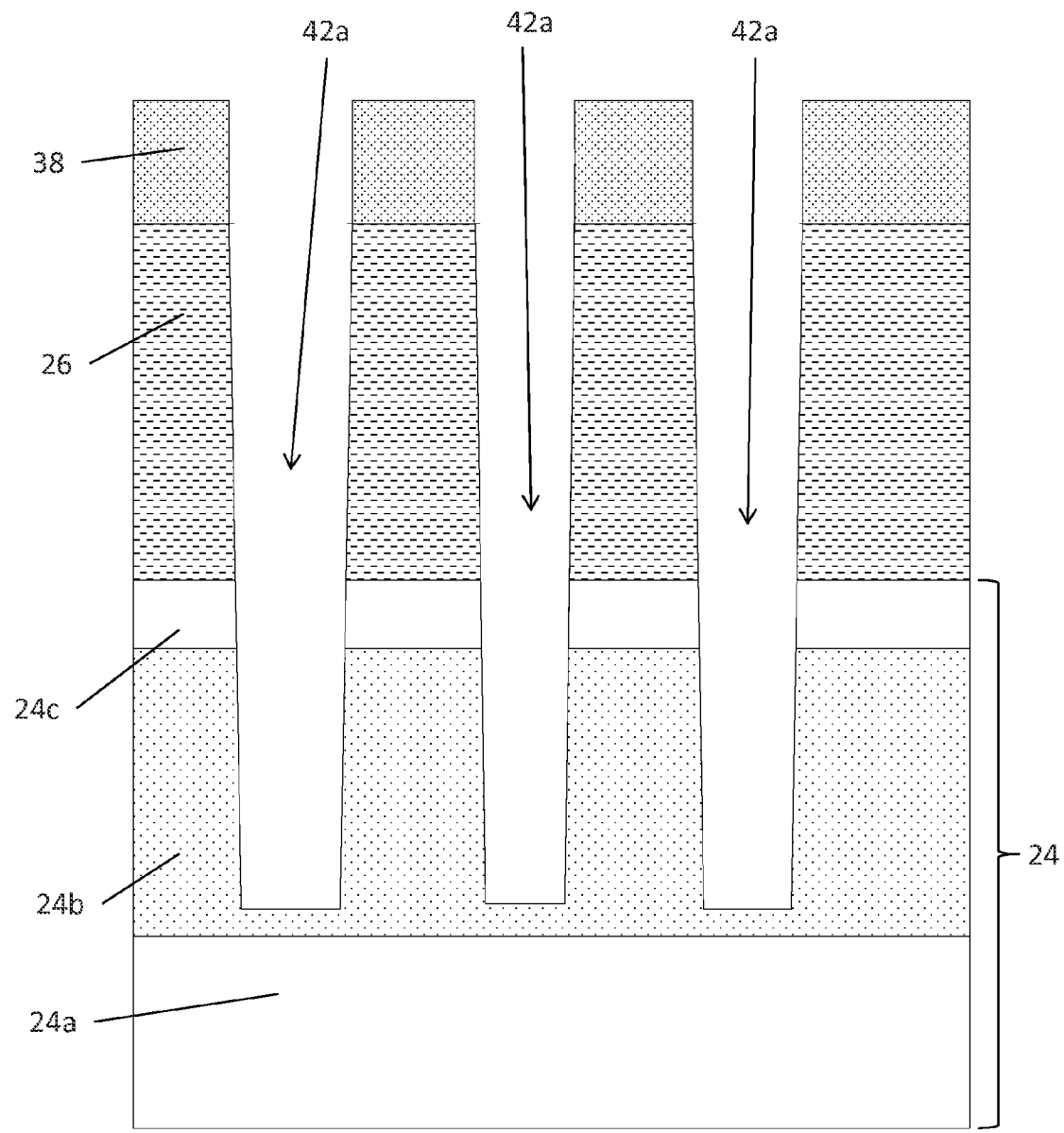

A highly direction etch as known in the art is then used with the mask 38 to etch openings 42*a* which extend completely through the insulating material 26, completely through the semiconductor layer 24*c* and into (but not completely through) the insulator layer 24*b* of the substrate 24. The result of the etch process is shown in FIG. 2C.

Figure 2D:
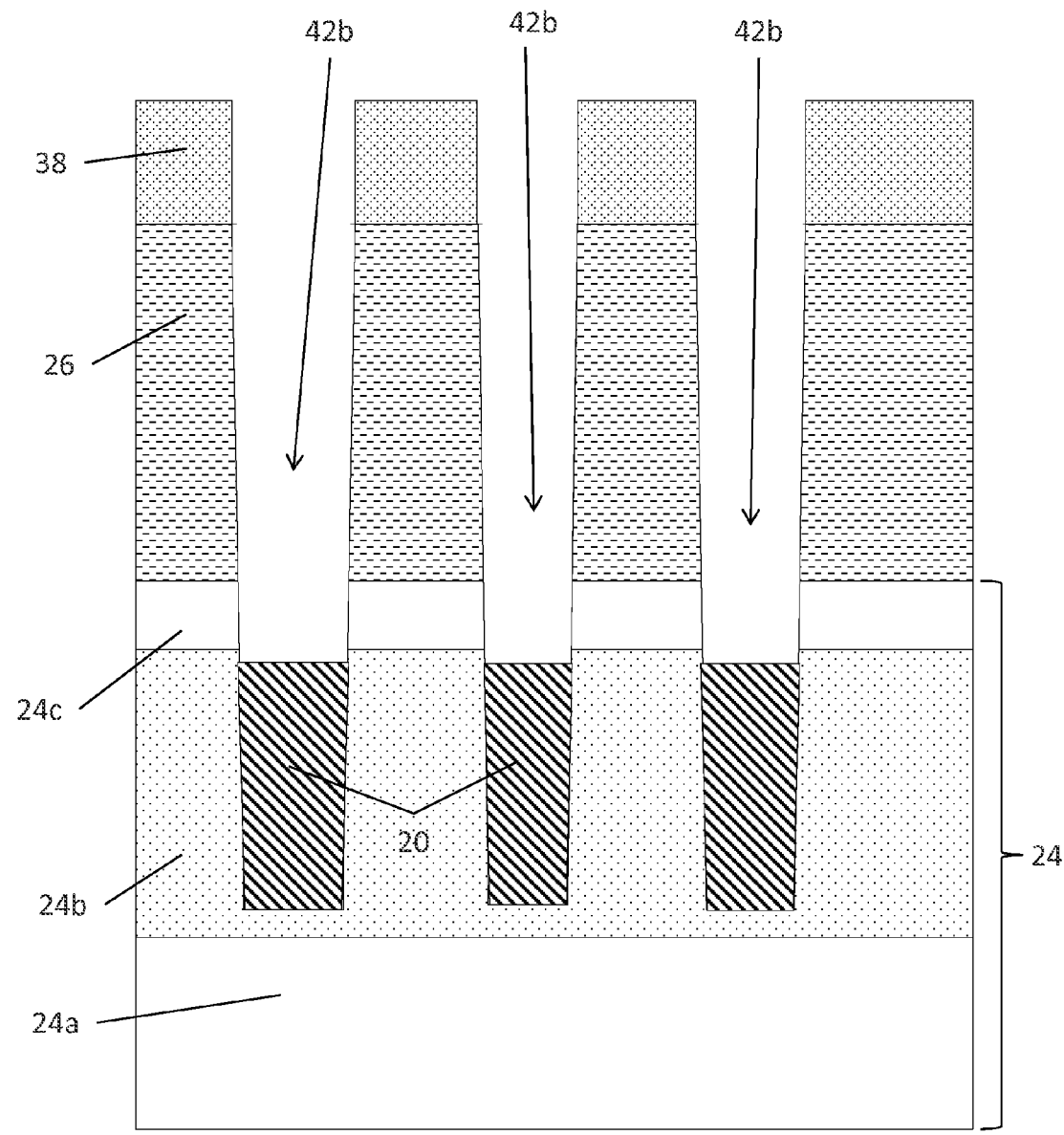

The openings 42*a* are then filled with a metal conductor material. As an example, the metal conductor material may comprise Tungsten (W). The fill operation may be performed using a chemical vapor deposition (CVD), as known in the art. The result of this deposition will produce metal material covering the mask 38. A chemical-mechanical polishing (CMP) operation is performed to remove the metal down to the level of the mask 38. An etch which is selective to remove the metal material, such as a plasma etch using $BCl_3$ chemistry, as known in the art, is then performed to recess the deposited metal material in the openings 42 to produce the source-drain contacts 20. The recess process removes the metal material down to a level at or below the interface between the insulator layer 24*b* and the semiconductor layer 24*c* and leaves openings 42*b*. The result of the fill, polish and etch process is shown in FIG. 2D.

Figure 2E:
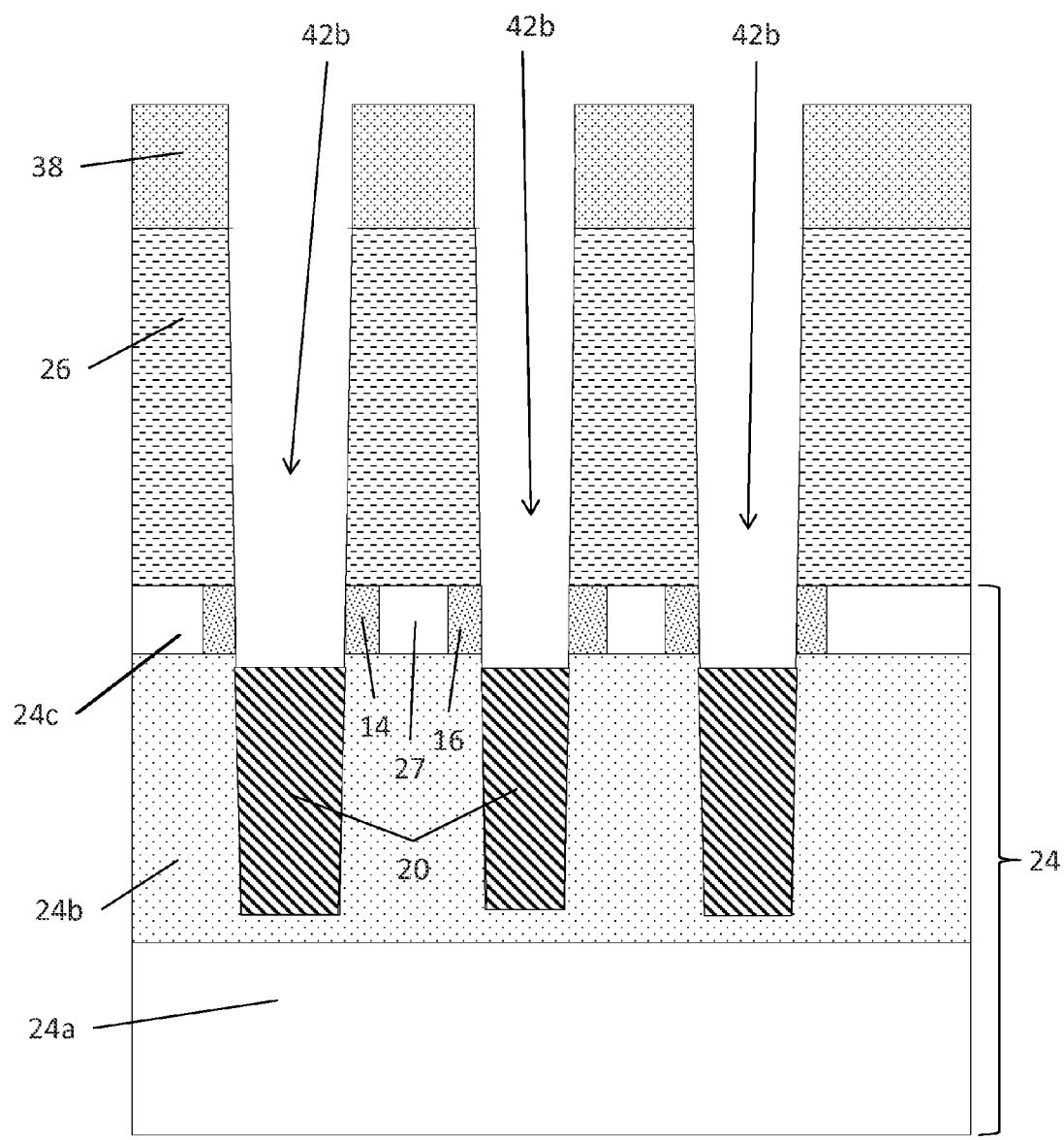

It will be noted that the openings 42*b* extend through the semiconductor layer 24*c* and thus sides of the openings 42*b* at the semiconductor layer 24*c* are exposed. A doping implantation is then performed through the openings 42*b* at the exposed sides to dope the semiconductor layer 24*c* and form the source regions 14 and drain regions 16 (with the portion of the semiconductor layer 24*c* between the doped source region 14 and drain region 16 defining the channel region 27. The result of the dopant implantation is shown in FIG. 2E.

The junction 22, including if desired a silicide contact 22*a*, is then formed within each opening 42*b* at the top of each gate contact 18. A number of different techniques are available to form the junction 22. In one embodiment, a liner silicide contact with an epitaxial growth may be formed within each opening 42*b* (see, FIG. 2F1 with epitaxial semiconductor region 22*b* and silicide region 22*a*). In another embodiment, a metal insulator semiconductor (MIS) type junction contact may be formed within each opening 42*b* (see, FIG. 2F2 with metal region 22*c* and thin insulator 22*d*). The techniques for forming the junction 22 within each opening 42*b* are well known in the art. The junction 22 functions to electrically connect the source-drain contact 20 within each opening 42*b* to the source region 14 and drain region 16 on either side of the opening 42*b*. The result of junction 22 formation is shown in FIG. 2F to leave openings 42*c*.

In the following process steps, the junction 22 of the liner silicide contact type (FIG. 2F1) is shown, but it will be understood that the process steps are equally applicable to use of the junction of the MIS type (FIG. 2F2).

Figure 2G:
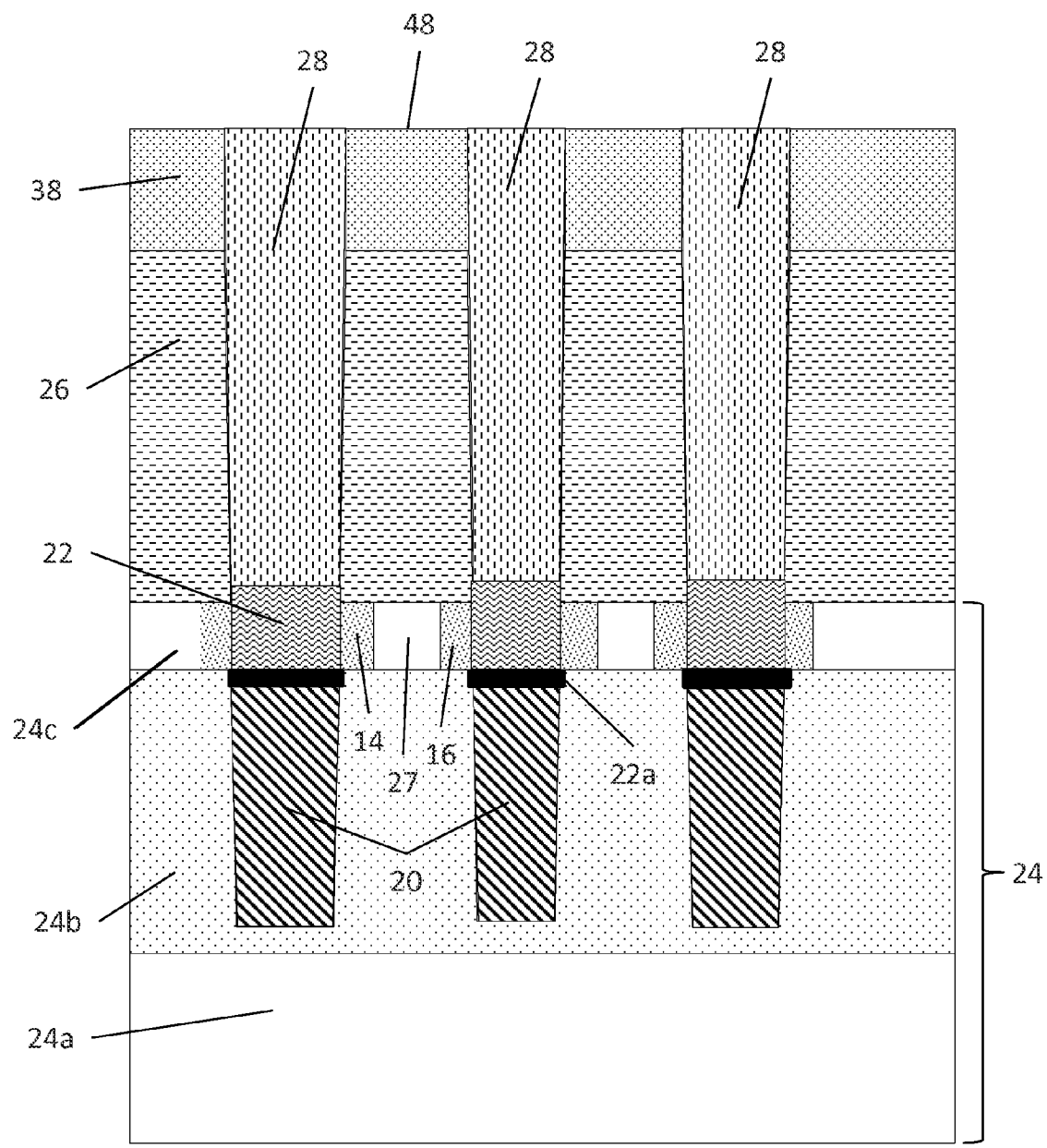

The openings 42*c* are then filled by a deposit of an insulating oxide material 28. The oxide material may comprise, for example, a flowable oxide and the deposit may be made using a chemical vapor deposition (CVD) followed by a steam anneal in a manner well known to those skilled in the art. The deposit of the material 28 will produce material covering the mask 38. A chemical-mechanical polishing (CMP) operation is performed to remove the material down to the level of the mask 38. The result of the deposit and polish operations is shown in FIG. 2G with planar top surface 48.

Figure 2H:
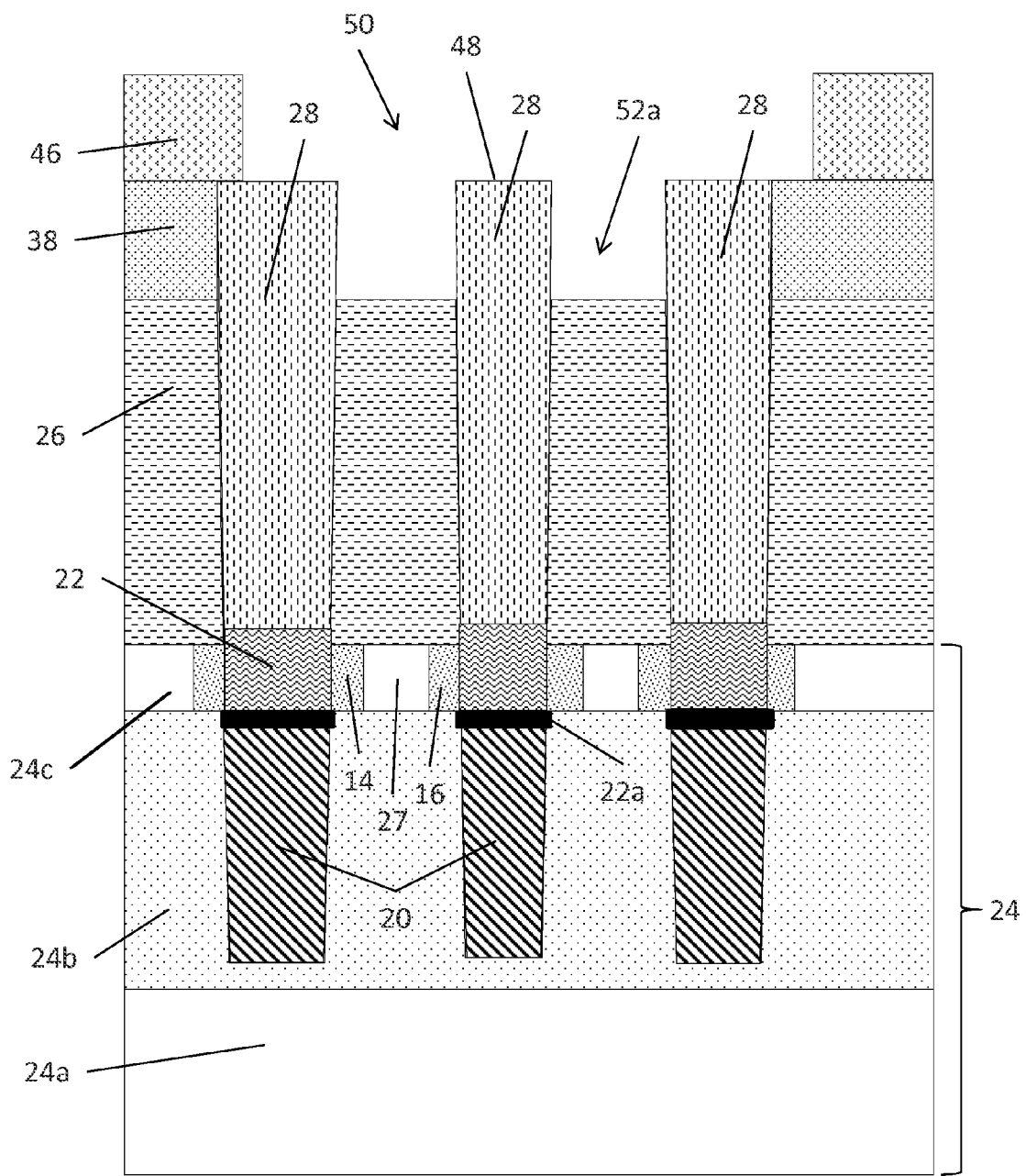
Figure 21:
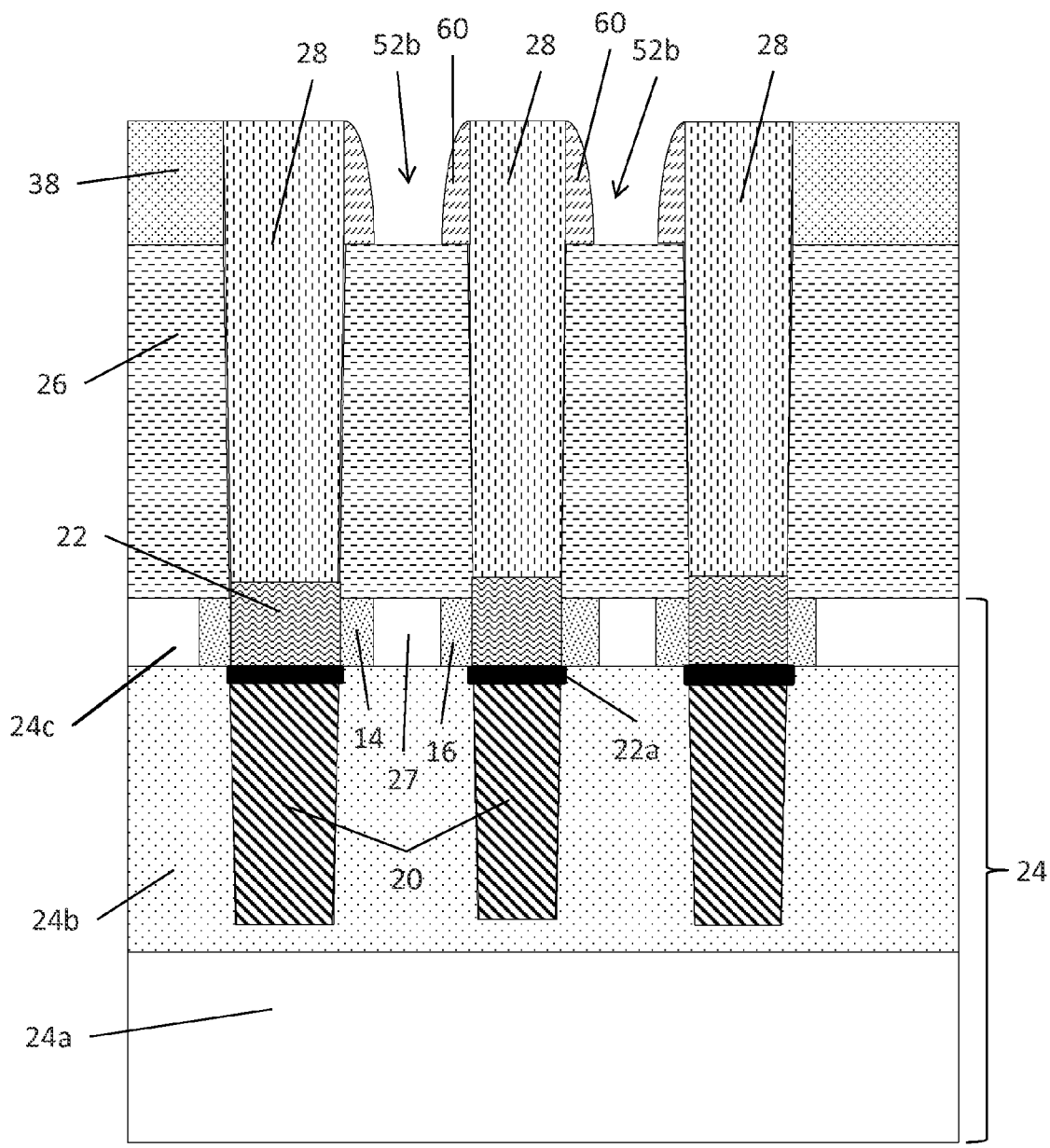

A patterned mask 46 is then formed on the planar top surface 48 of the wafer, the mask 46 including an opening 50 which corresponds to the locations where the transistors 10 are to be formed (see, FIG. 1). The material used for the patterned mask 46 may, for example, comprise organic material patterned using a lithographic etch in a manner well known to those skilled in the art. An etch is then used with the mask 46 to etch openings 52*a* which remove the mask 38 in the area of the transistors 10. The result of the patterned mask 46 formation and subsequent etch is shown in FIG. 2H.

The mask 46 is then removed. A conformal deposit of a spacer material is then made on the wafer and within the openings 52*a*. A highly directional etch, such as an RIE, is then performed to remove the planar portions of that conformal deposit. The result of that etch is to produce sidewall spacers 60 on the side walls of the openings 52*a*. The region between adjacent spacers 60 defines an opening 52*b*. The result of the conformal deposit and subsequent etch is shown in FIG. 2I.

Figure 2J:
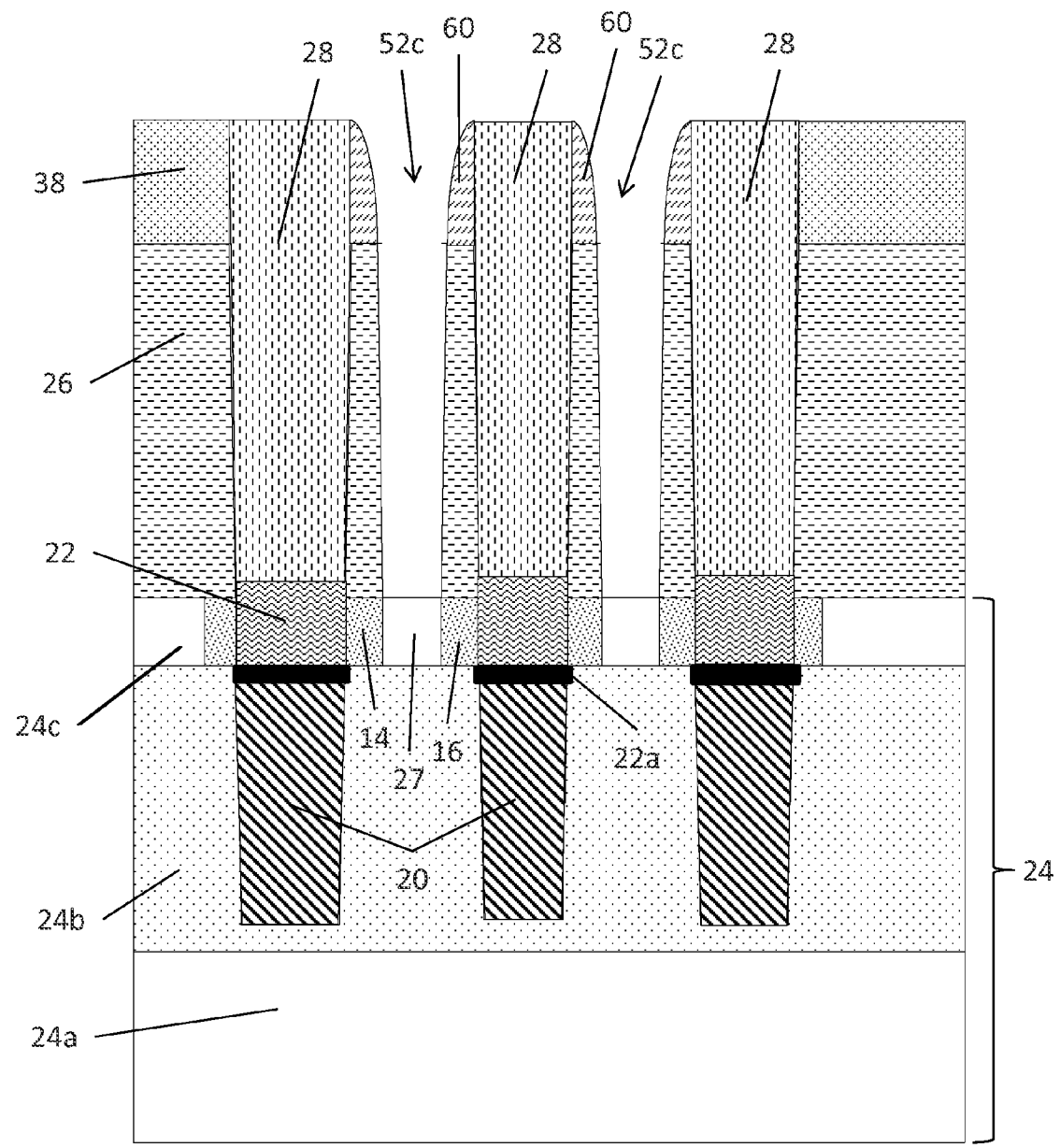

The spacers 60 with openings 52*b* are the used as a mask and a highly directional etch is performed to etch openings 52*c* which extend completely through the insulating material 26 to reach the a top surface of semiconductor layer 24*c* at the location of the channel region 27. This corresponds to the location of the gate regions 12 for the transistors 10 (see, FIG. 1). The etch may comprise, for example, a fluorine based plasma etch as known in the art. The result of the etch process is shown in FIG. 2J.

Figure 2K:
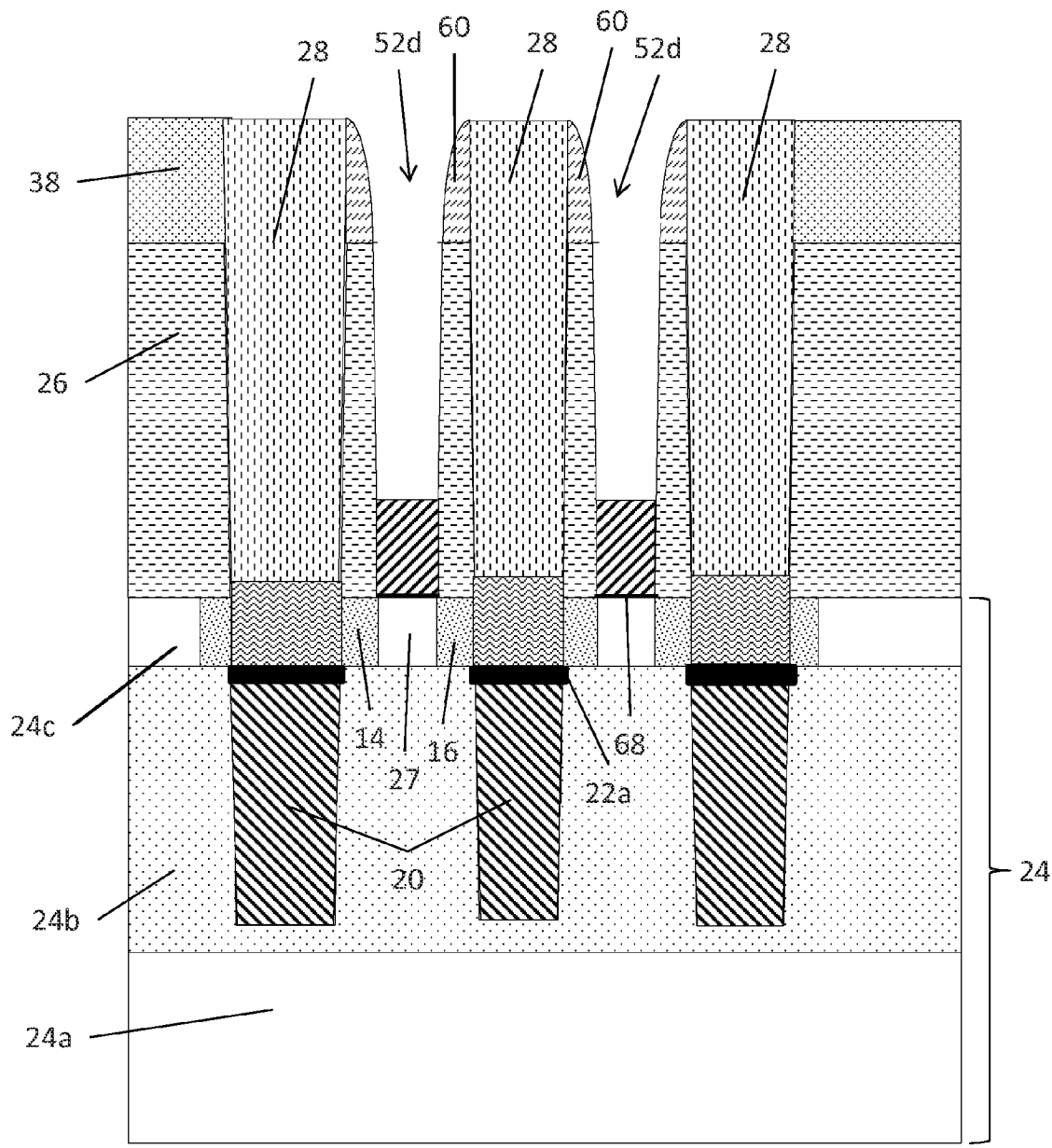

A thin layer of a high-k dielectric material is then deposited to line the openings 52*c*. This layer defines the gate dielectric 68 for the transistor. The high-k dielectric material may comprise $HfO_2$ deposited using an atomic layer deposition (ALD) process as known in the art. The openings 52*c* are then filled with a metal conductor material which comprises a work function metal (WFM) as known in the art. As an example, the metal conductor material may comprise TiN, TiC, TiAl, TaN, TaC, and the like. The fill operation may be performed using a chemical vapor deposition (CVD) as known in the art. The result of this deposition will produce metal material covering the wafer. A chemical-mechanical polishing (CMP) operation is performed to remove the metal down to the level of the mask 38. An etch which is selective to the metal material, as known in the art, is then performed to recess the deposited metal material in the openings 52*c* to produce the gate region 12 (see, for example, U.S. Pat. No. 8,617,973 or 8,679,909, the disclosures of which are incorporated by reference). The recess process removes a large portion of the metal material within the openings 52c and leaves openings 52d. The result of the line, fill, polish and etch process is shown in FIG. 2K.

Figure 2L:
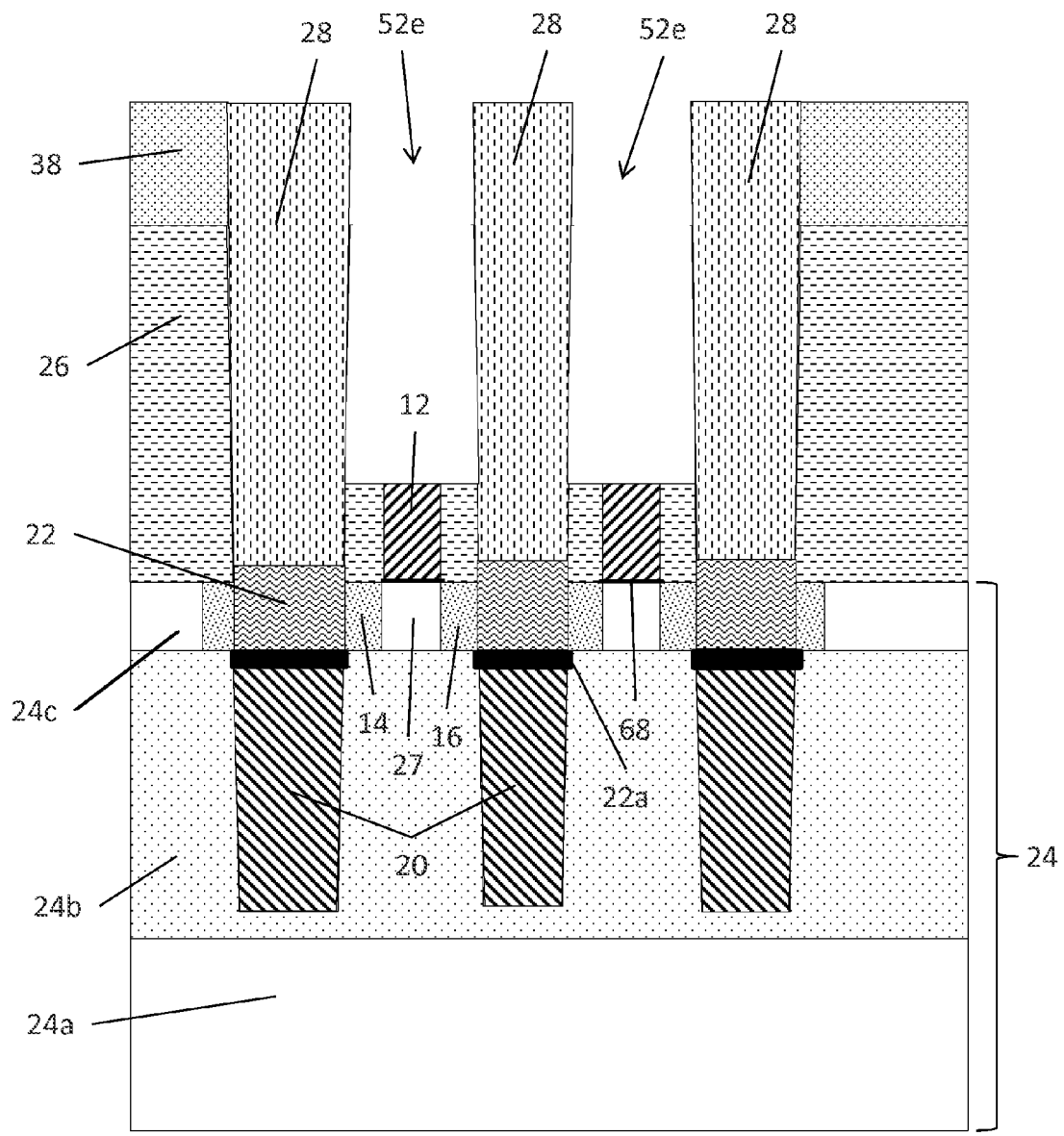
Figure 2M:
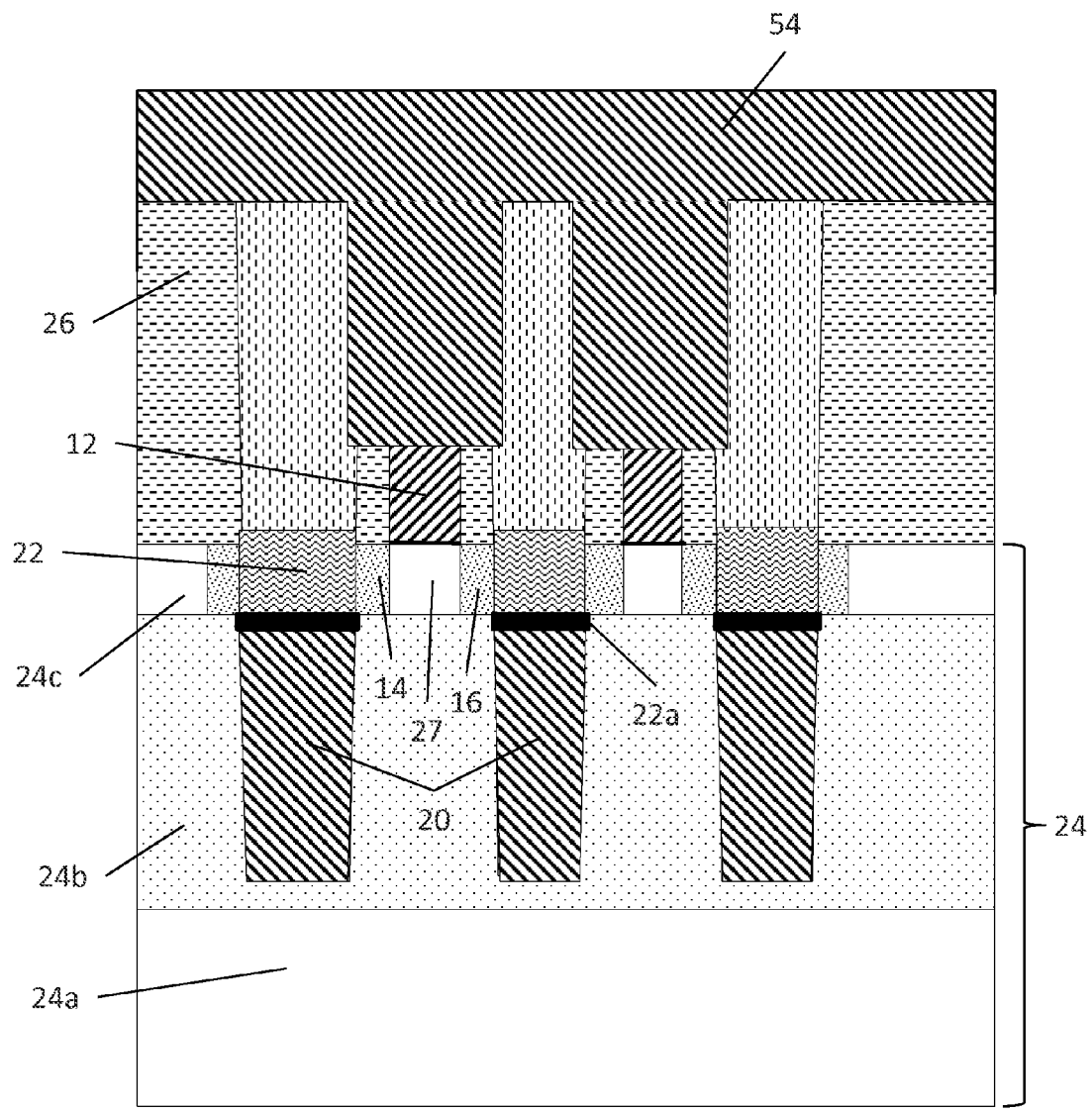

A selective etch as known the art is then performed to remove both the spacers 60 and the etched portion of the insulating material 26 which defines the openings 52d down to the level of the gate region 12. The result of the etch process is shown in FIG. 2L to produce an opening 52e at each transistor gate region 12.

An optional oxidation of the wafer is then performed. This operation expands the size of each opening 52e.

The openings 52e are then filled with a metal conductor material 54. As an example, the metal conductor material may comprise Tungsten (W). The fill operation may be performed using a chemical vapor deposition (CVD), as known in the art. The result of this deposition will produce metal material covering the wafer. See, FIG. 2M. A chemical-mechanical polishing (CMP) operation is performed to remove the metal down to a desired thickness of the integrated circuit. The result of the polish process produces the integrated circuit with gate contacts 18 as shown in FIG. 1.

It will be understood that the integrated circuit of FIG. 1 may be subjected to further processing including the formation of contacts extending from the top surface of the wafer downward through the premetal dielectric (layers 26 and or 28) to make electrical contact to the source-drain contacts 20. Reference is now also made to FIG. 3A. Those skilled in the art understand that such contacts would be made by an electrical via 60 structure positioned away from the gate contact 18 and extending downward through the insulating layer(s) forming the pre-metal dielectric to reach the source-drain contact 20. Additionally, an electrical via 62 structure may be provided to make electrical contact to the gate contacts 16. FIG. 3A shows a plan view of the integrated circuit showing an exemplary location of the vias 60 and 62 relative to the transistors 10 in general and the gate contact 18 and source-drain contact 20 in particular.

The implementation of FIG. 1, and the process of FIGS. 2A-2M, utilize a substrate 24 of the SOI type. The advantages of the buried source-drain contact 20 for transistor layouts with small pitch scaling can be achieved with other substrate types as well.

Figure 4:
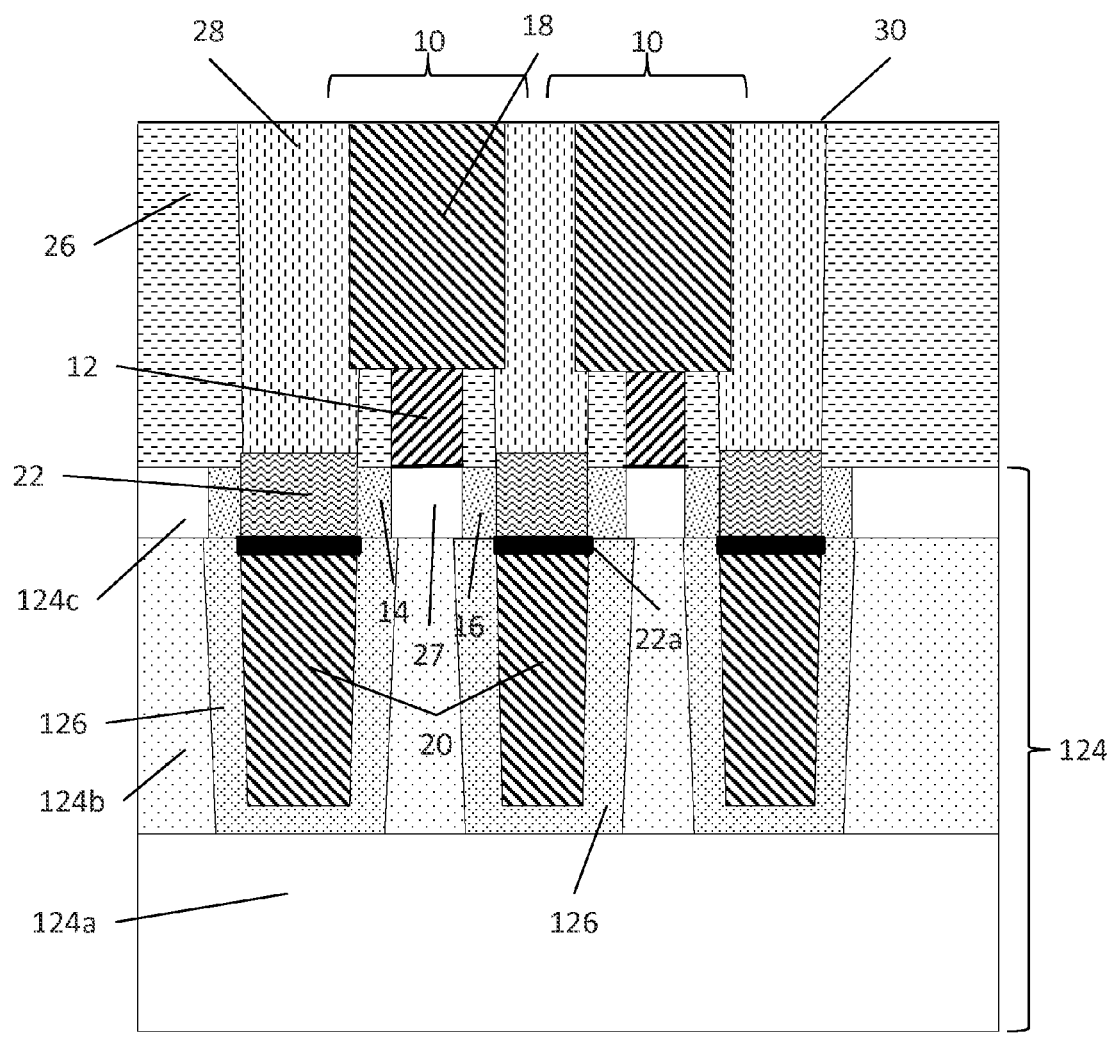
FIG. 4 is a cross-sectional diagram of an alternative embodiment of a plurality of transistors which utilize a buried contact made to the transistor source-drain regions.

Reference is now made to FIG. 4 which illustrates a cross-sectional diagram of a plurality of transistors utilizing a buried contact made to the transistor source-drain regions where the substrate is of a bulk semiconductor type. Like reference numbers refer to like or similar parts. The transistors 10 are formed on and in a substrate 124. In the illustrated embodiment of FIG. 4, the substrate 124 comprises a bulk type substrate including a silicon layer 124a, a silicon-germanium layer 124b and a silicon layer 124c which are stacked on top of each other in a manner well known to those skilled in the art. Because the silicon-germanium layer 124b is semiconductive, the buried source-drain contacts 20 are insulated from the silicon-germanium layer 124b within an insulated trench 126.

Reference is now made to FIGS. 5A-5G, plus FIGS. 2E-2M, which illustrate process steps for forming the integrated circuit shown in FIG. 4.

Figure 5A:
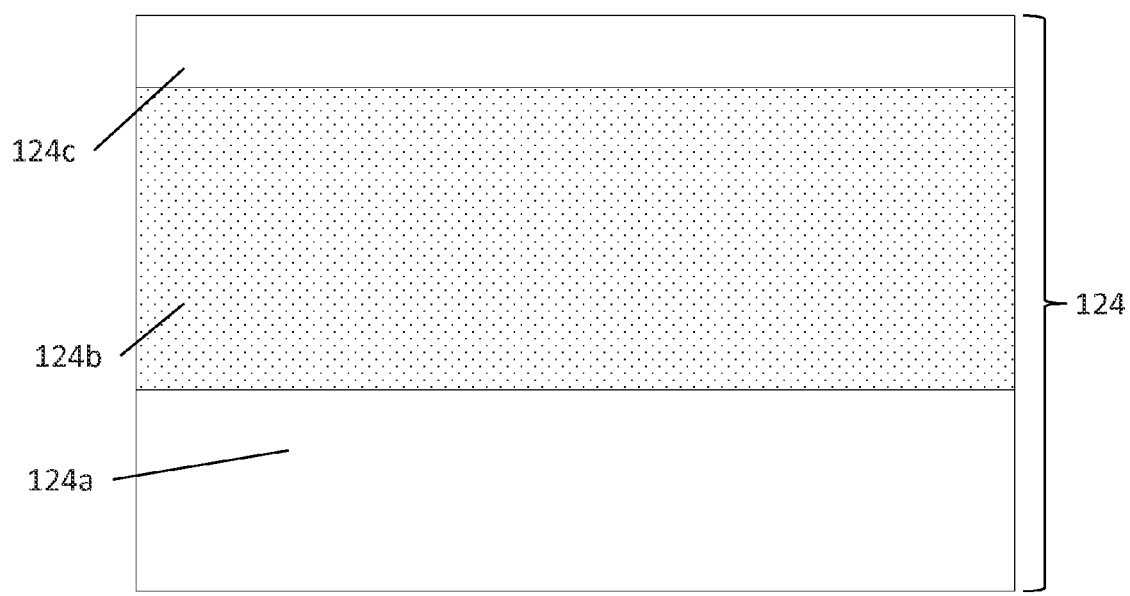
FIGS. 5A-5G, along with FIGS. 2E-2M, illustrate process steps for forming the integrated circuit shown in FIG. 4.

FIG. 5A shows the starting bulk substrate 124 (provided in a wafer format) including a base substrate layer 124a (for example, formed of silicon), a first semiconductor layer 124b (for example, formed of silicon-germanium) and a second semiconductor layer 124c (for example, made of silicon). The semiconductor layer 124c is preferably patterned in the shape of a fin structure as known to those skilled in the art and familiar with the fabrication of FINFET-type transistors (see, for example, the fins illustrated in FIG. 3B). The layers of substrate 124 are stacked with the first semiconductor layer 124b positioned in contact with and between the base substrate layer 124a and the second semiconductor layer 124c. The second semiconductor layer 124c may be doped if desired or alternatively may be fully depleted.

Figure 5B:
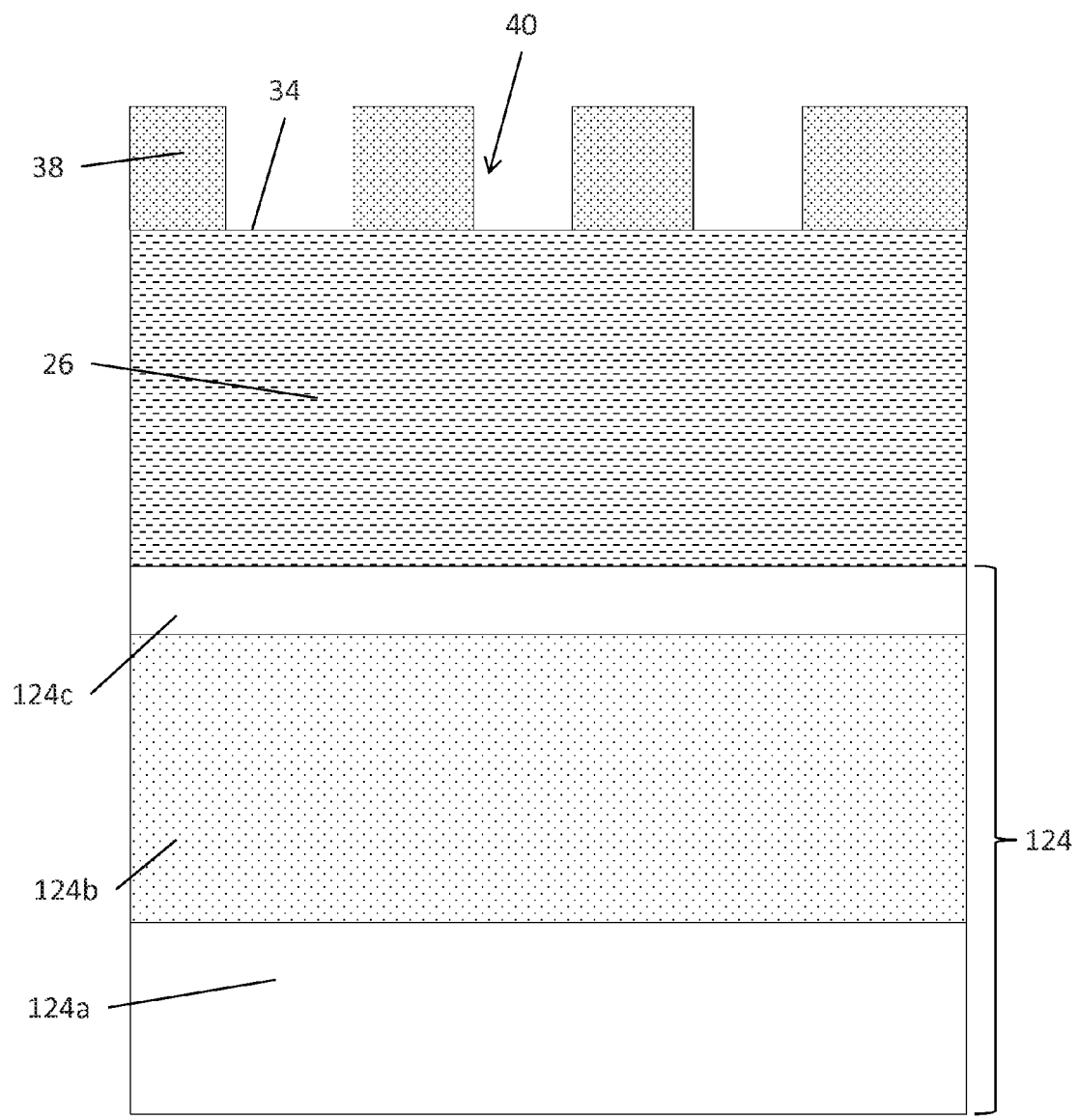

FIG. 5B illustrates the deposition of an insulating material 26 over the wafer on a top surface of the substrate 124. If the second semiconductor layer 124c has been patterned to form fins, the insulating material 26 will fill areas between adjacent fins (not explicitly shown) and reach down to the second semiconductor layer 124b. In a preferred implementation, the insulating material 26 comprises a low-k dielectric material, for example, made of silicon nitride (SiN). The deposit of insulating material 26 is conformal, and thus a top surface of the deposited material may not be planar. In such a case, a chemical-mechanical polishing (CMP) operation is performed to provide a planar top surface 34. A patterned mask 38 is then formed on the planar top surface 34, the mask 38 including a number of openings 40 which correspond to the locations where source-drain contacts 20 (see, FIG. 4) are to be formed. The material used for the patterned mask 38 may, for example, comprise a-Si material patterned using a lithographic etch in a manner well known to those skilled in the art.

Figure 5C:
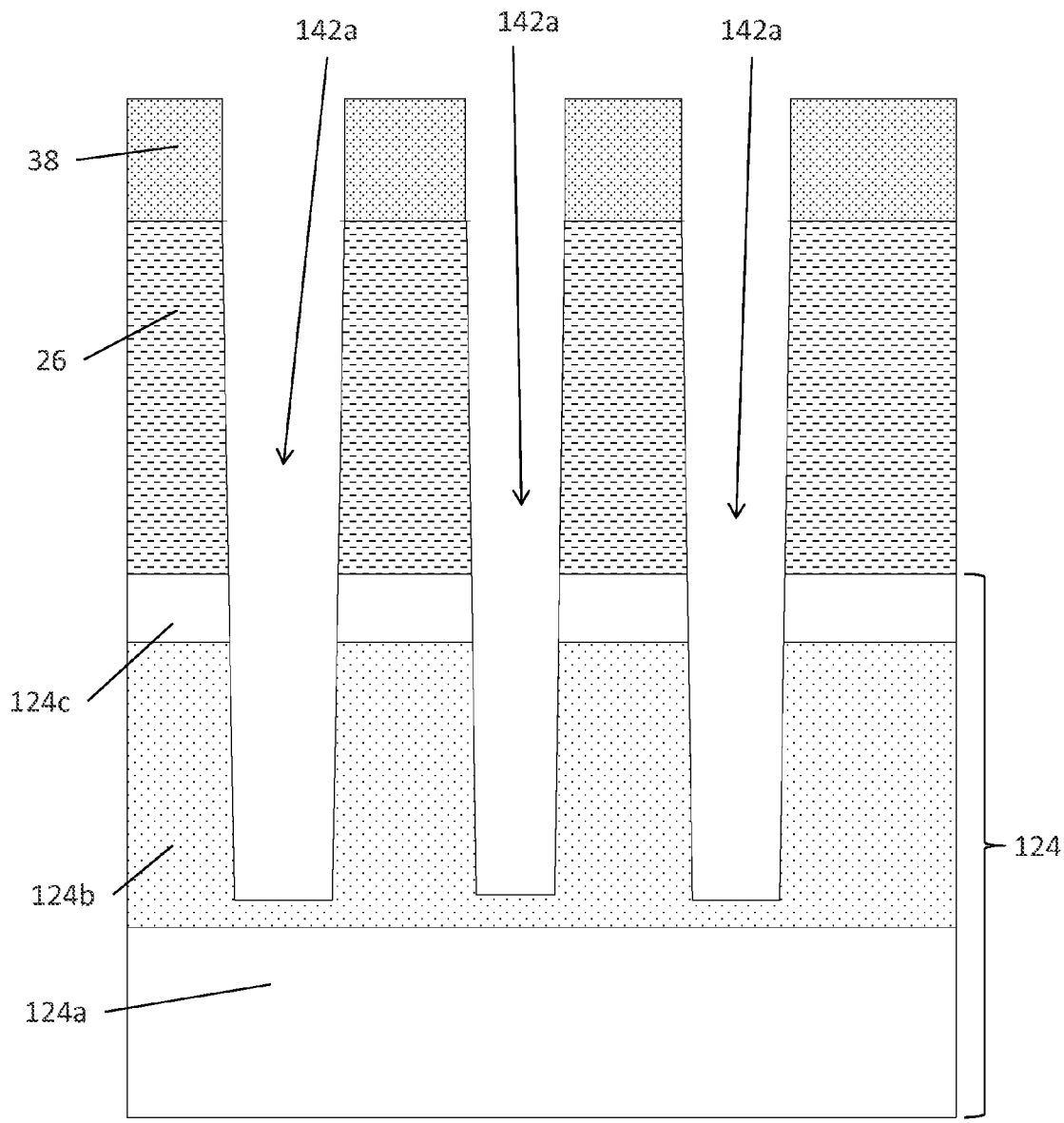

A highly direction etch as known to those skilled in the art is then used with the mask 38 to etch openings 142a which extend completely through the insulating material 26, completely through the semiconductor layer 124c and into (but not completely through) the semiconductor layer 124b of the substrate 124. The result of the etch process is shown in FIG. 5C.

Figure 5D:
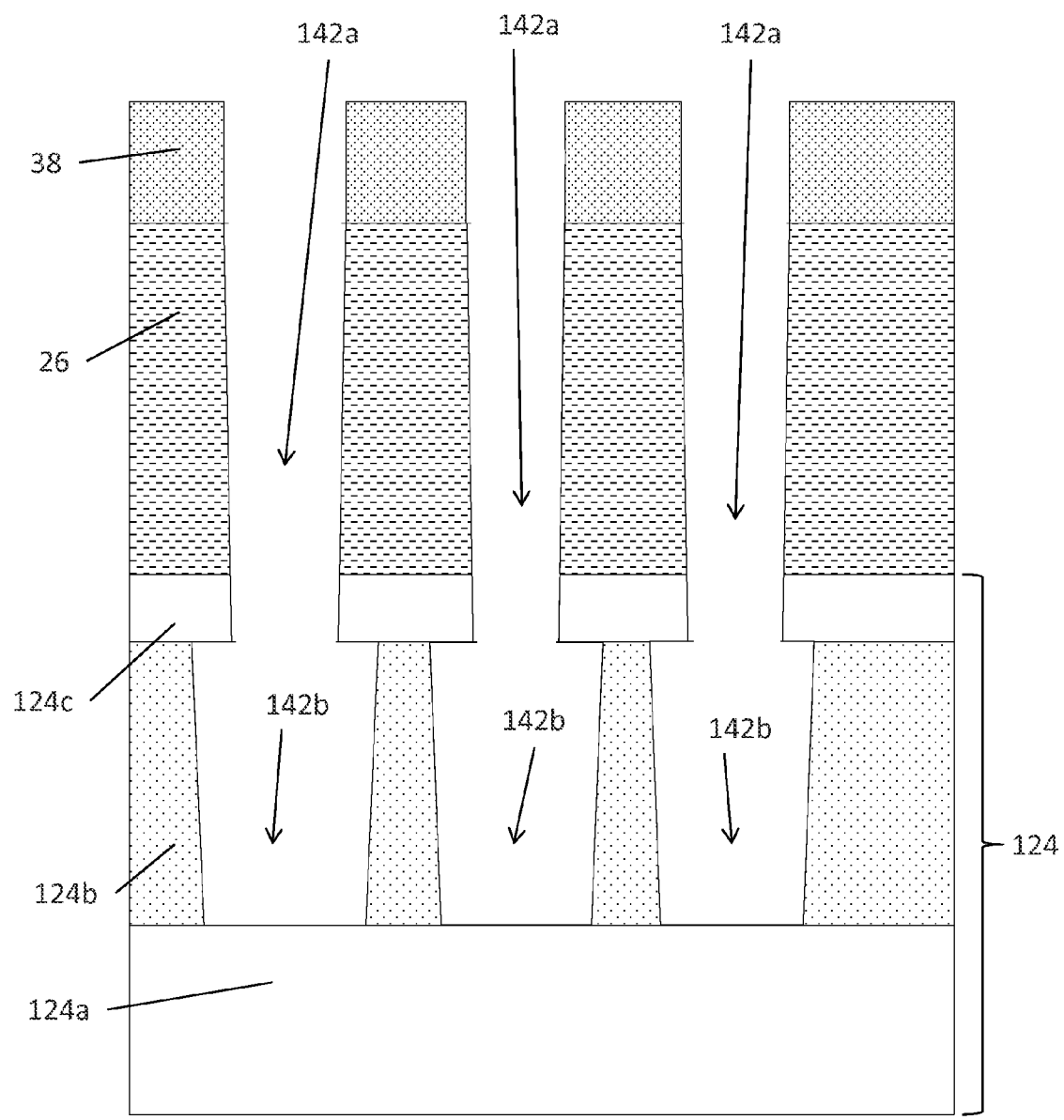

An isotropic etch of the first semiconductor layer 124b of the substrate 124 is then performed. This etch is selective as to silicon so as to suppress etching of the semiconductor layer 124c. The isotropic etch may comprise a gap phase HCl dry etch as known to those skilled in the art. The result of the etch process is shown in FIG. 5D to form trench regions 142b in the first semiconductor layer 124b of the substrate 124 aligned with the etch openings 142a.

Figure 5E:
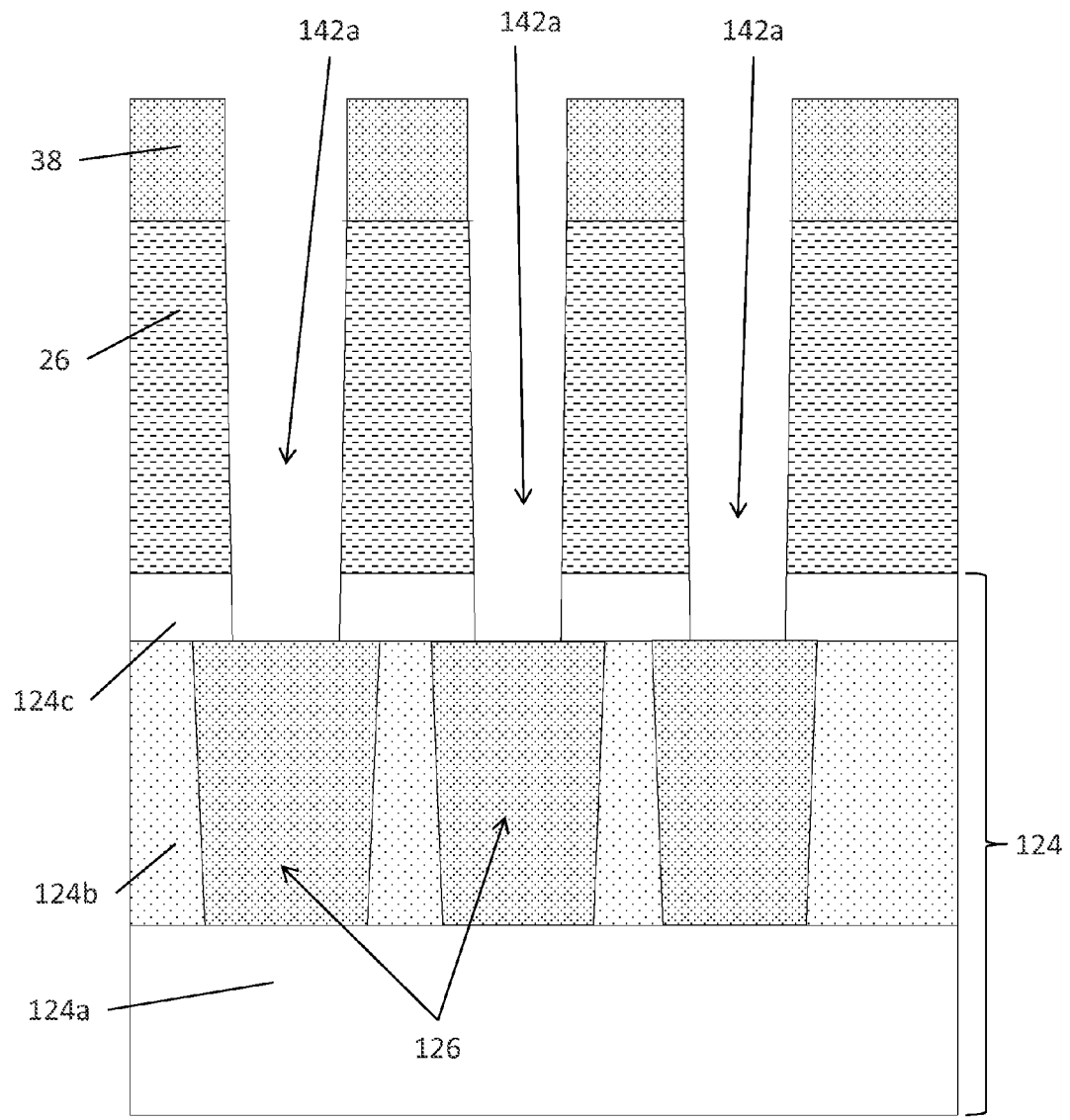

The trench regions 142b are then filled with an insulating material 126. The material 126 may, for example, comprise an oxide material such as silicon oxide. The filling of the trench regions 142b with the oxide material 126 may be accomplished using a thermal oxide growth as known to those skilled in the art. The result of the fill operation is shown in FIG. 5E. It will be understood, although not explicitly shown in FIG. 5E, that the material 126 filling the trench regions 142b may preferably overfill into the openings 142a.

Figure 5F:
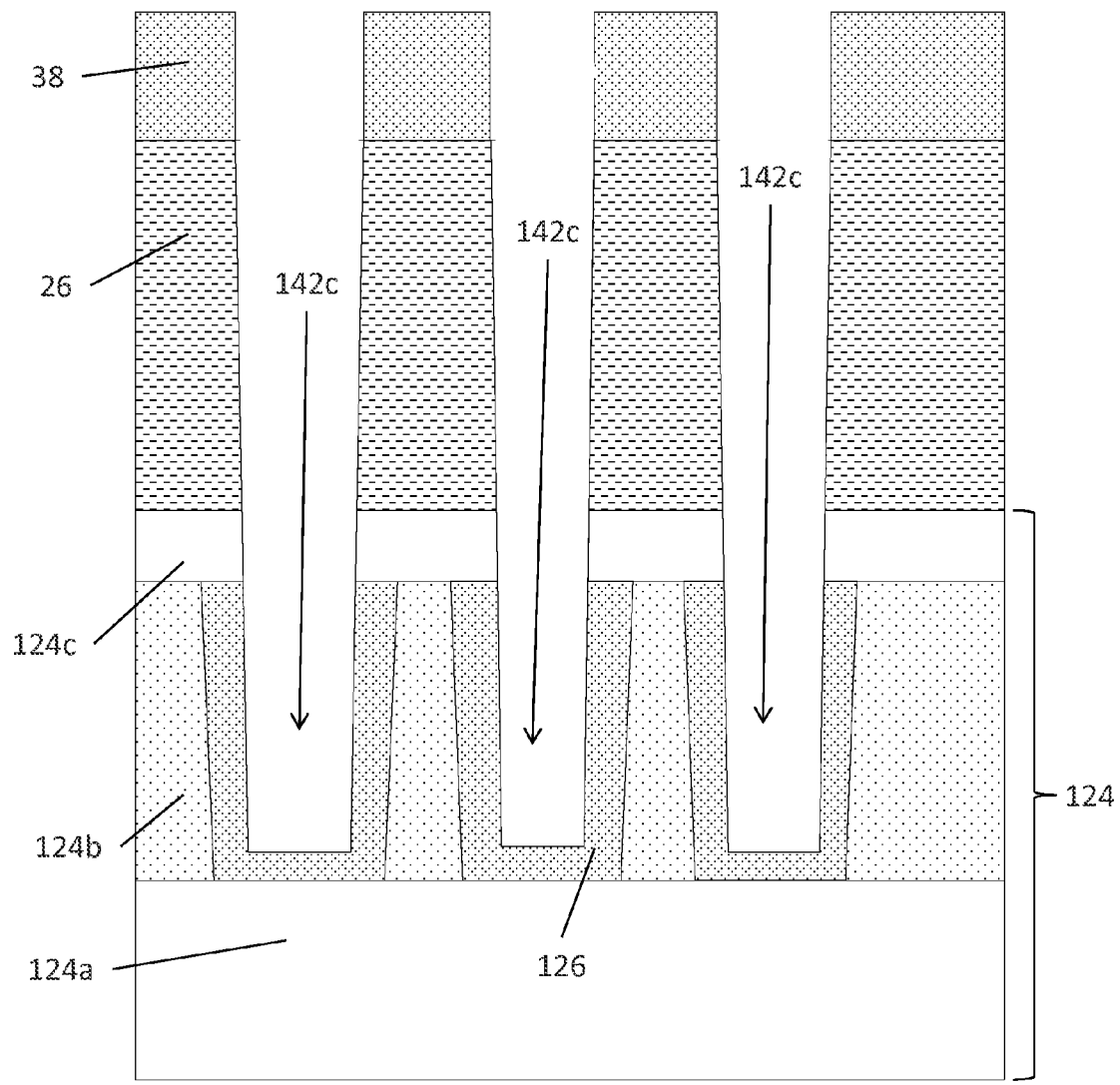

A highly directional etch (as known in the art) which preferentially removes the oxide insulating material 126 is then performed form trench openings 142c in the oxide insulating material 126. The result of the etch is shown in FIG. 5F.

Figure 5G:
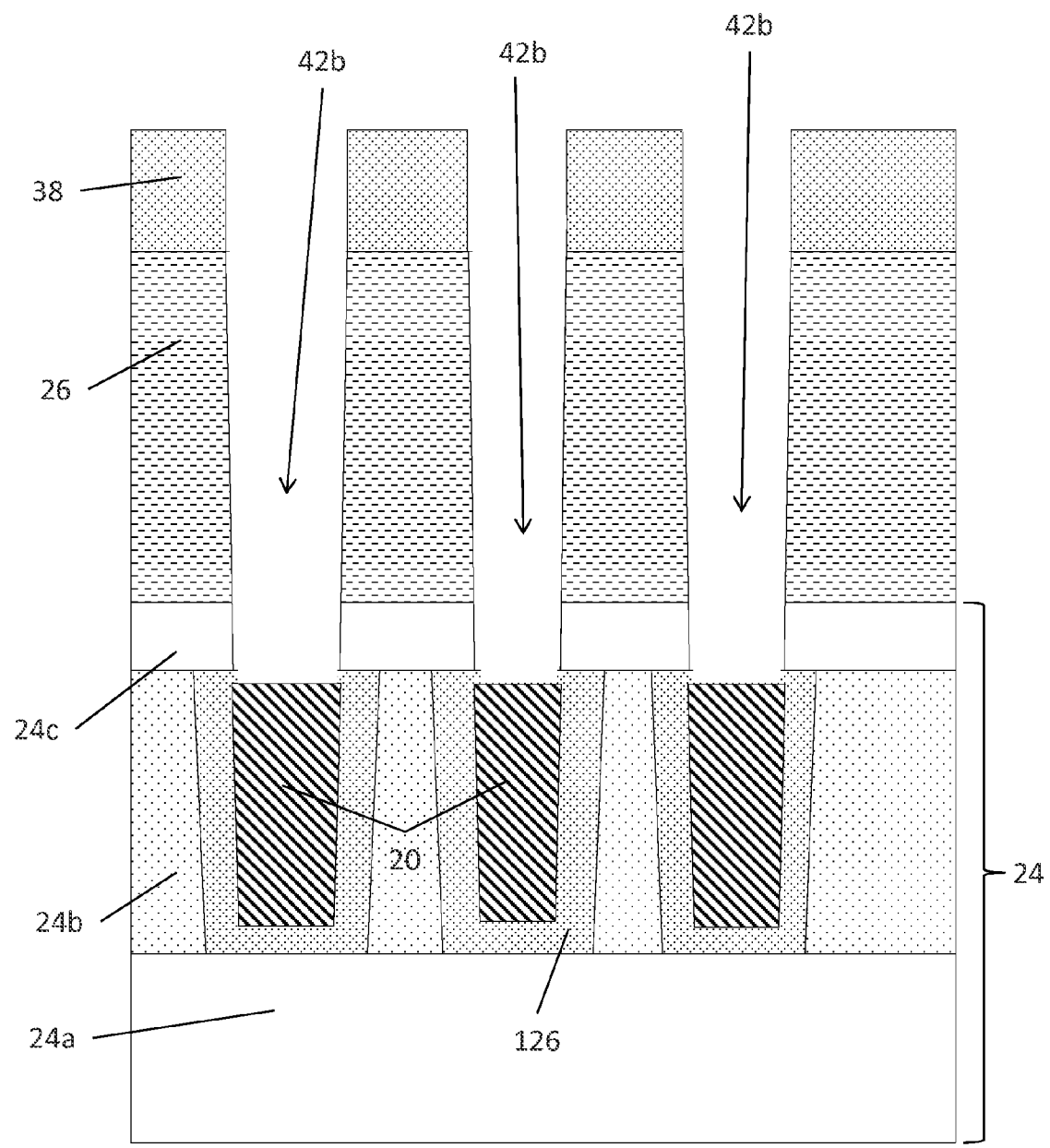

The openings 142c are then filled with a metal conductor material. As an example, the metal conductor material may comprise Tungsten (W). The fill operation may be performed using a chemical vapor deposition (CVD), as known in the art. The result of this deposition will produce metal material covering the mask 38. A chemical-mechanical polishing (CMP) operation is performed to remove the metal down to the level of the mask 38. An etch which is selective to remove the metal material, such as a $BCl_3$ plasma etch, as known in the art, is then performed to recess the deposited metal material in the openings 142c to produce the source-drain contacts 20. The recess process removes the metal material down to a level at or below the interface between the semiconductor layer 124b and the semiconductor layer 124c and leaves openings 42b. The result of the fill, polish and etch process is shown in FIG. 5G.

At this point, the fabrication process continues with FIGS. 2E to 2M so as to produce the integrated circuit shown in FIG. 4. The fabrication process steps of FIG. 2E-2M are incorporated by reference to follow the fabrication process steps of FIGS. 5A-5G.

Figure 6:
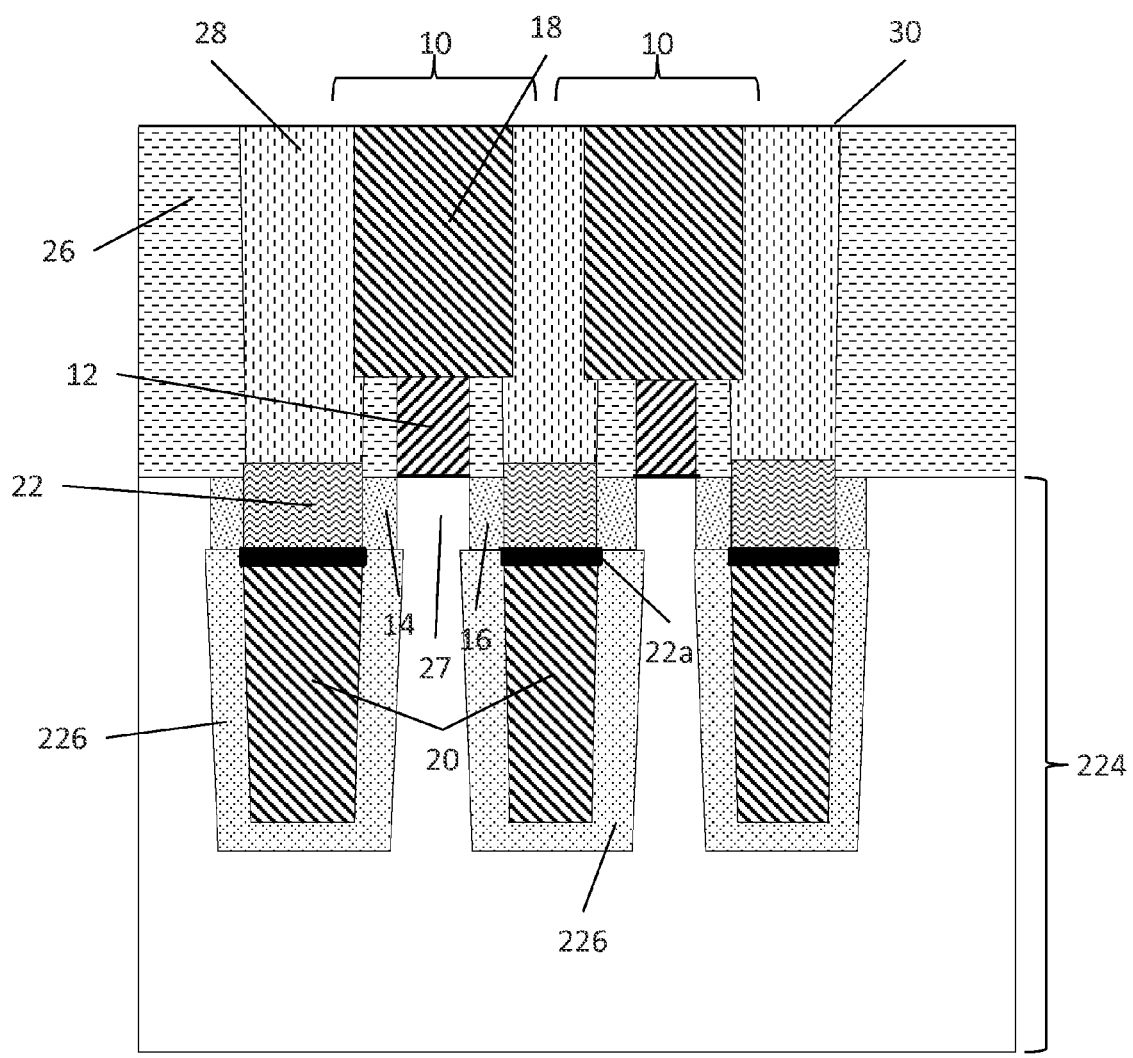
FIG. 6 is a cross-sectional diagram of an alternative embodiment of a plurality of transistors which utilize a buried contact made to the transistor source-drain regions.

Reference is now made to FIG. 6 which illustrates a cross-sectional diagram of a plurality of transistors utilizing a buried contact made to the transistor source-drain regions where the substrate is of a bulk semiconductor type. Like reference numbers refer to like or similar parts. The transistors 10 are formed on and in a substrate 224. In the illustrated embodiment of FIG. 6, the substrate 224 comprises a bulk type substrate for example formed of silicon in a manner well known to those skilled in the art. Because the silicon substrate 224 is semiconductive, the buried source-drain contacts 20 are insulated from the silicon substrate 224 within an insulated trench 226.

Reference is now made to FIGS. 7A-7I, plus FIGS. 2E-2M, which illustrate process steps for forming the integrated circuit shown in FIG. 6.

Figure 7A:
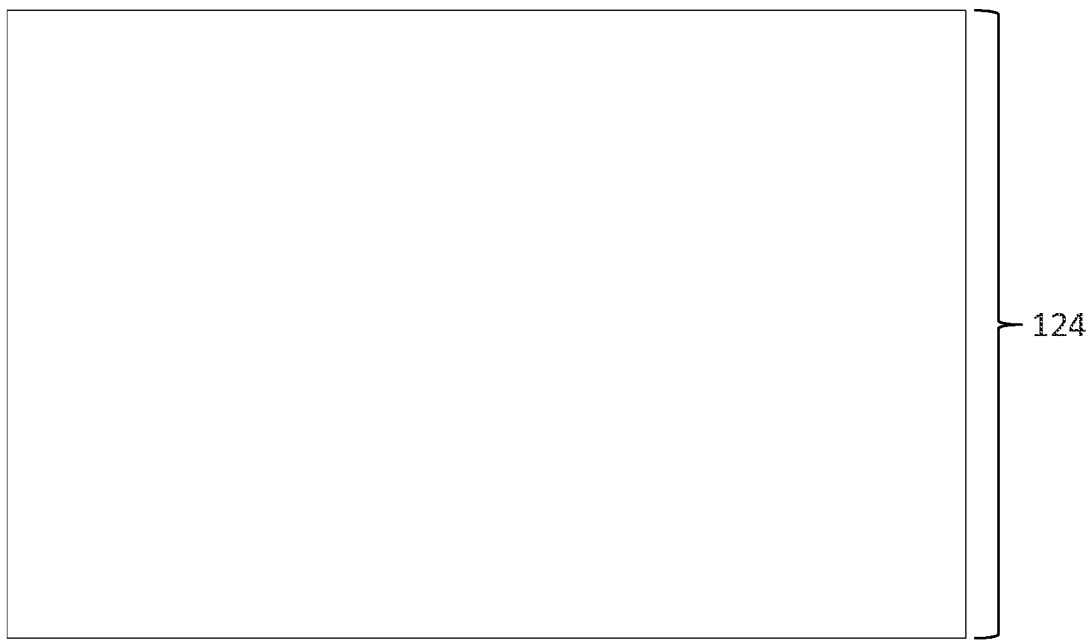
FIGS. 7A-7I, along with FIGS. 2E-2M, illustrate process steps for forming the integrated circuit shown in FIG. 6.

FIG. 7A shows the starting bulk substrate 224 (provided in a wafer format) that is formed, for example, of silicon. The semiconductor substrate 224 may be doped as desired or required for the given application. The top surface of the substrate 224 may be patterned, if desired, to for fins (see, for example, FIG. 3B).

Figure 7B:
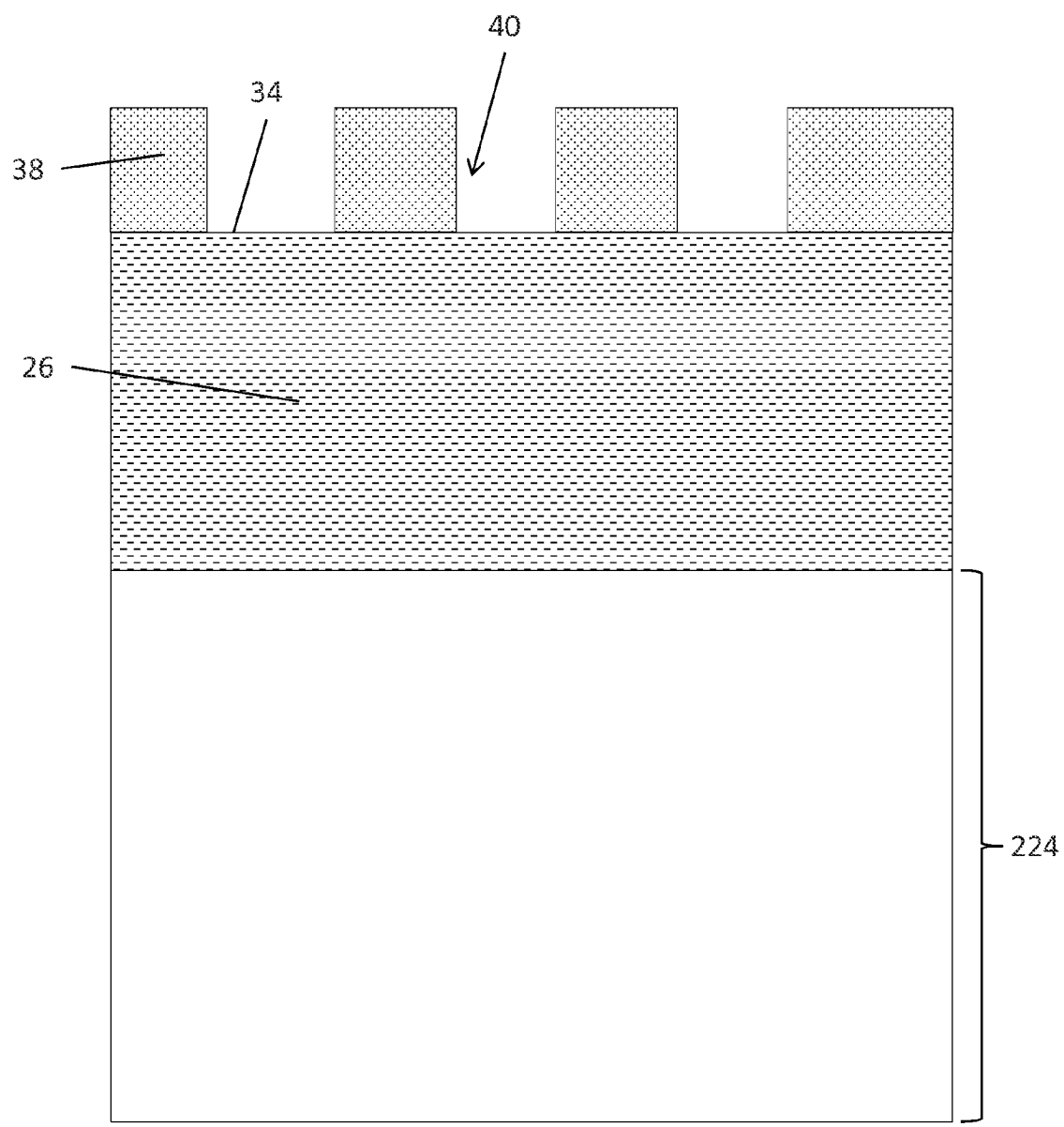

FIG. 7B illustrates the deposition of an insulating material 26 over the wafer on a top surface of the substrate 224. In a preferred implementation, the insulating material 26 comprises a low-k dielectric material, for example, made of silicon nitride (SiN). The deposit of insulating material 26 is conformal, and thus a top surface of the deposited material may not be planar. In such a case, a chemical-mechanical polishing (CMP) operation is performed to provide a planar top surface 34. A patterned mask 38 is then formed on the planar top surface 34, the mask 38 including a number of openings 40 which correspond to the locations where source-drain contacts 20 (see, FIG. 6) are to be formed. The material used for the patterned mask 38 may, for example, comprise a-Si material patterned using a lithographic etch in a manner well known to those skilled in the art.

Figure 7C:
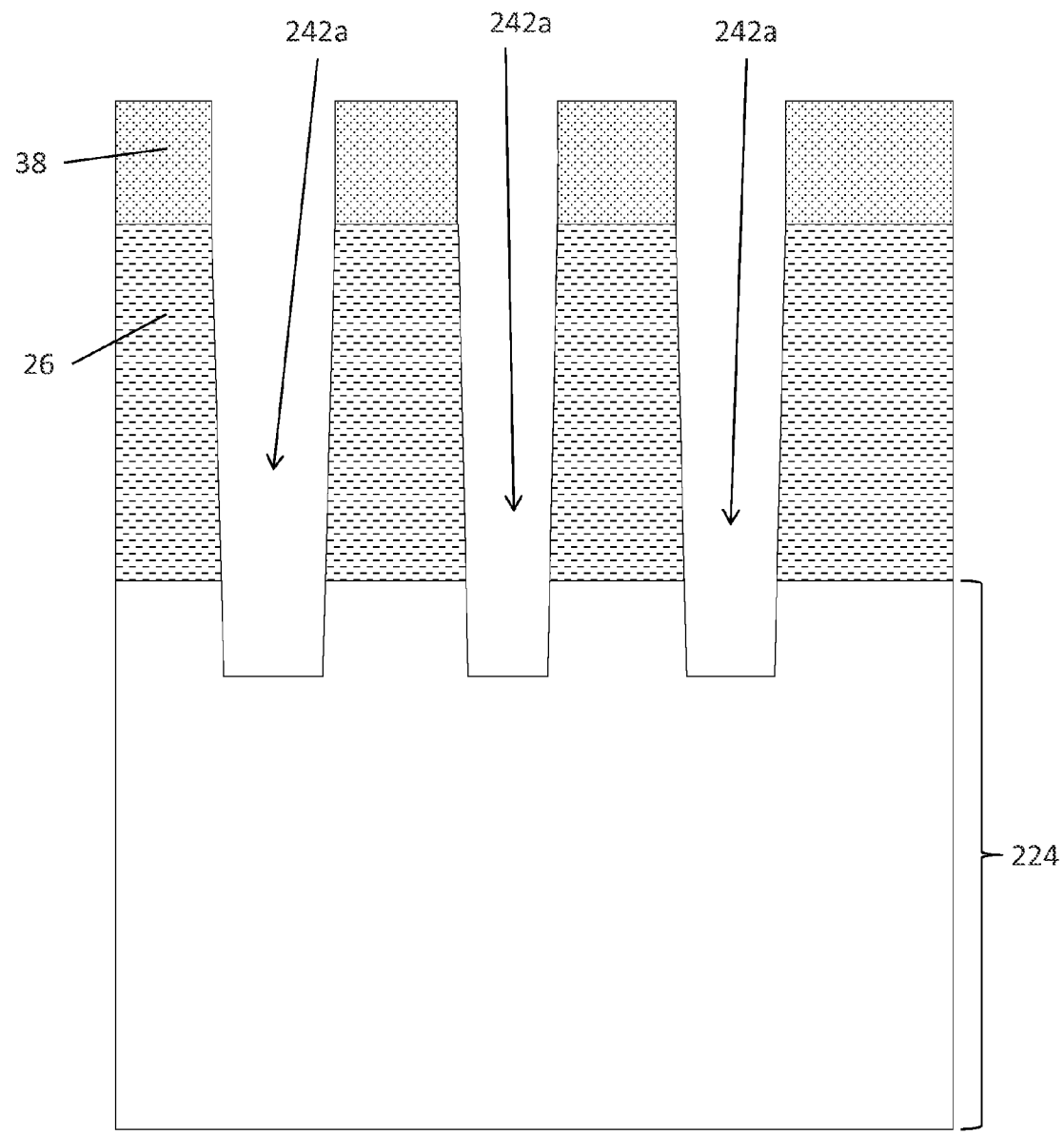

A highly direction etch as known to those skilled in the art is then used with the mask 38 to etch openings 242a which extend completely through the insulating material 26 and into (but not completely through) the semiconductor substrate 224. The result of the etch process is shown in FIG. 7C.

Figure 7D:
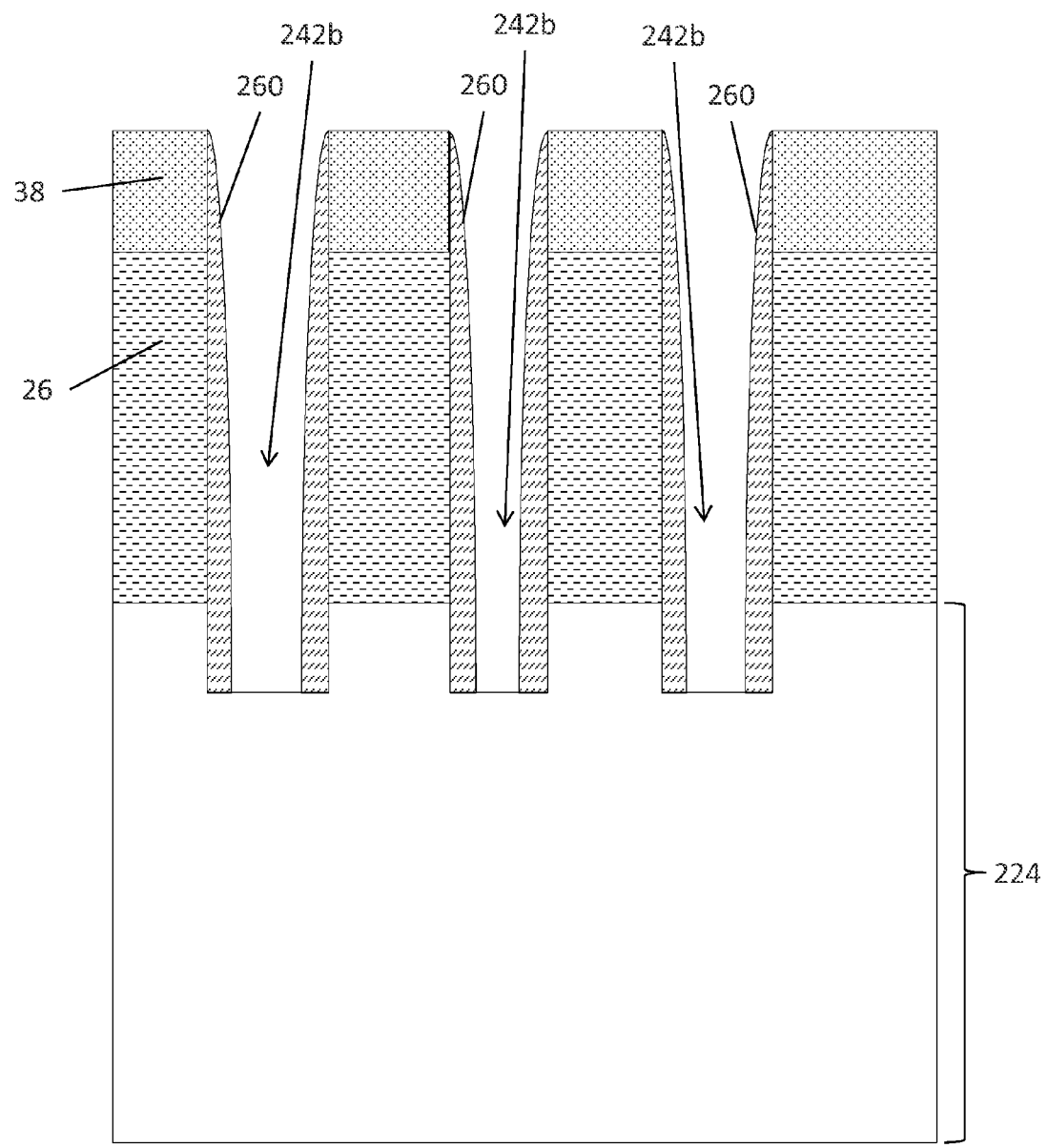

A conformal deposit of a spacer material is then made on the wafer and within the openings 242a. A highly directional etch, such as an RIE, is then performed to remove the planar portions of that conformal deposit. The result of that etch is to produce sidewall spacers 260 on the side walls of the openings 242a. The region between adjacent spacers 260 defines an opening 242b. The result of the conformal deposit and subsequent etch is shown in FIG. 7D.

Figure 7E:
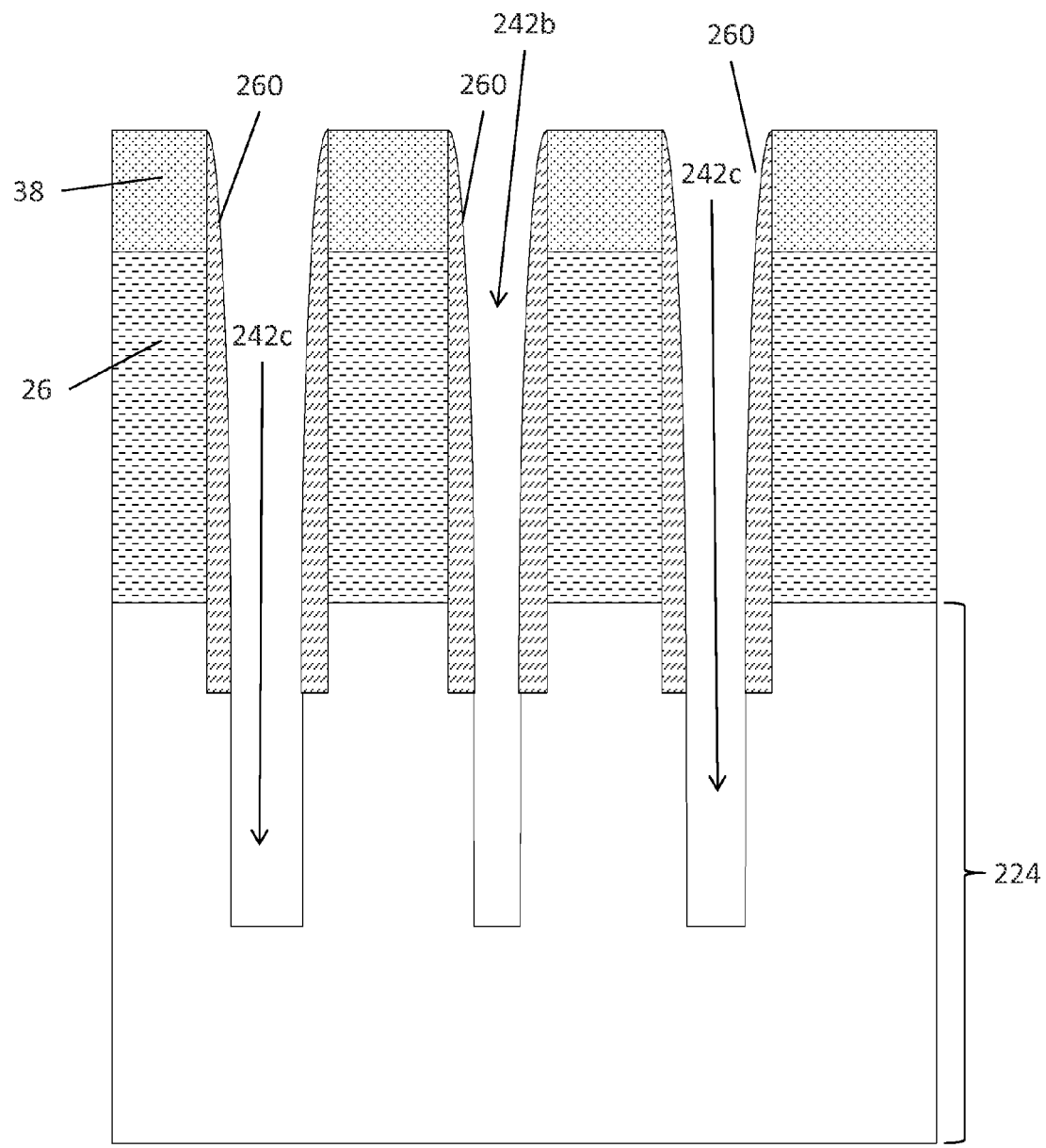

The spacers 260 with openings 242b are the used as a mask and a highly directional etch as known in the art is performed to etch openings 242c which extend deeper into the semiconductor substrate 224. These openings 242c correspond to the locations of the source-drain contacts 20 12 for the transistors 10 (see, FIG. 6). The result of the etch process is shown in FIG. 7E.

Figure 7F:
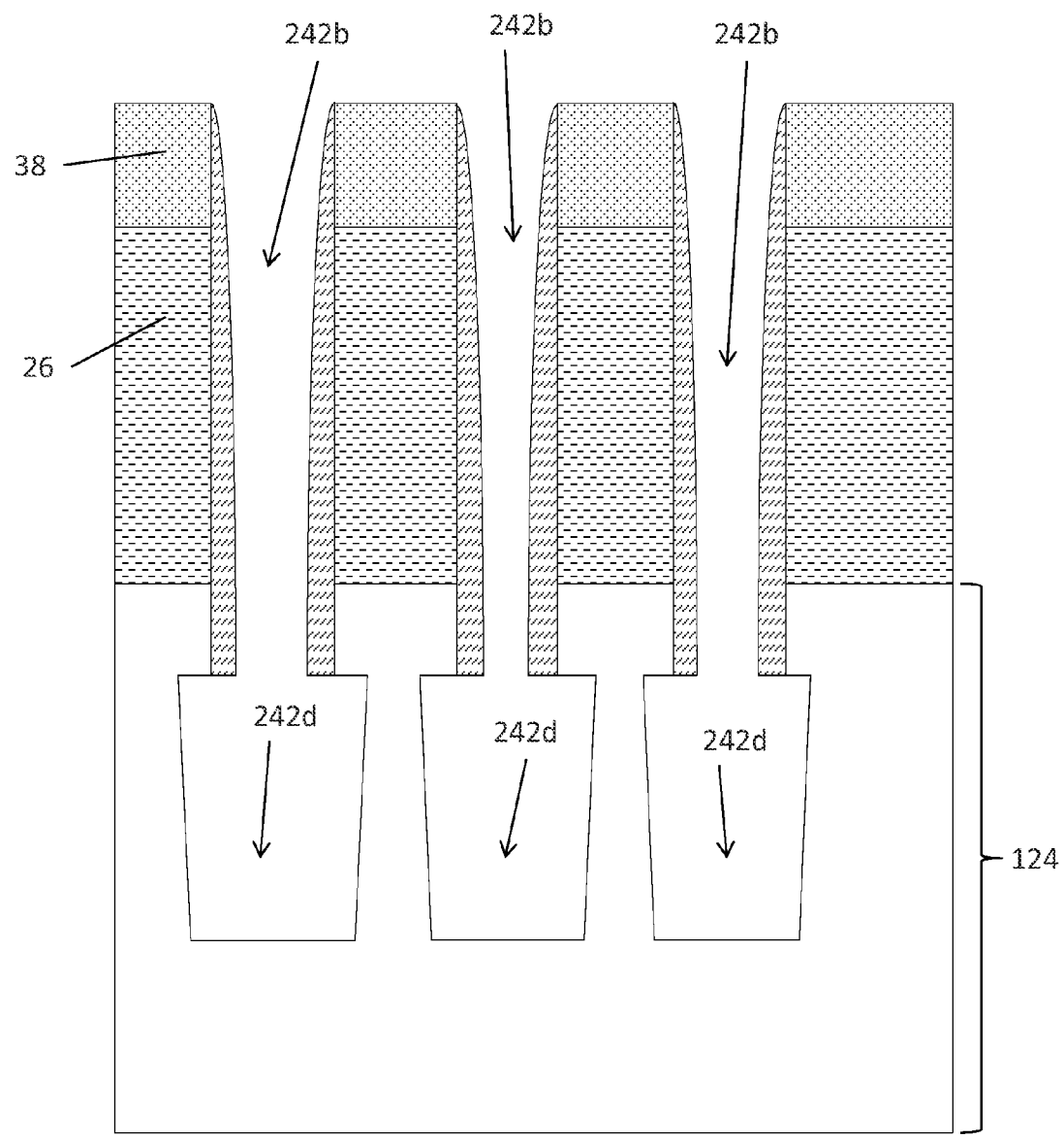

An isotropic etch of the semiconductor substrate 224 is then performed through the openings 242c. The isotropic etch may comprise an $SF_6/Cl_2$ based plasma etch as known to those skilled in the art. The result of the etch process is shown in FIG. 7F to form trench regions 242d in the substrate 224 aligned with the etch openings 242c.

Figure 7G:
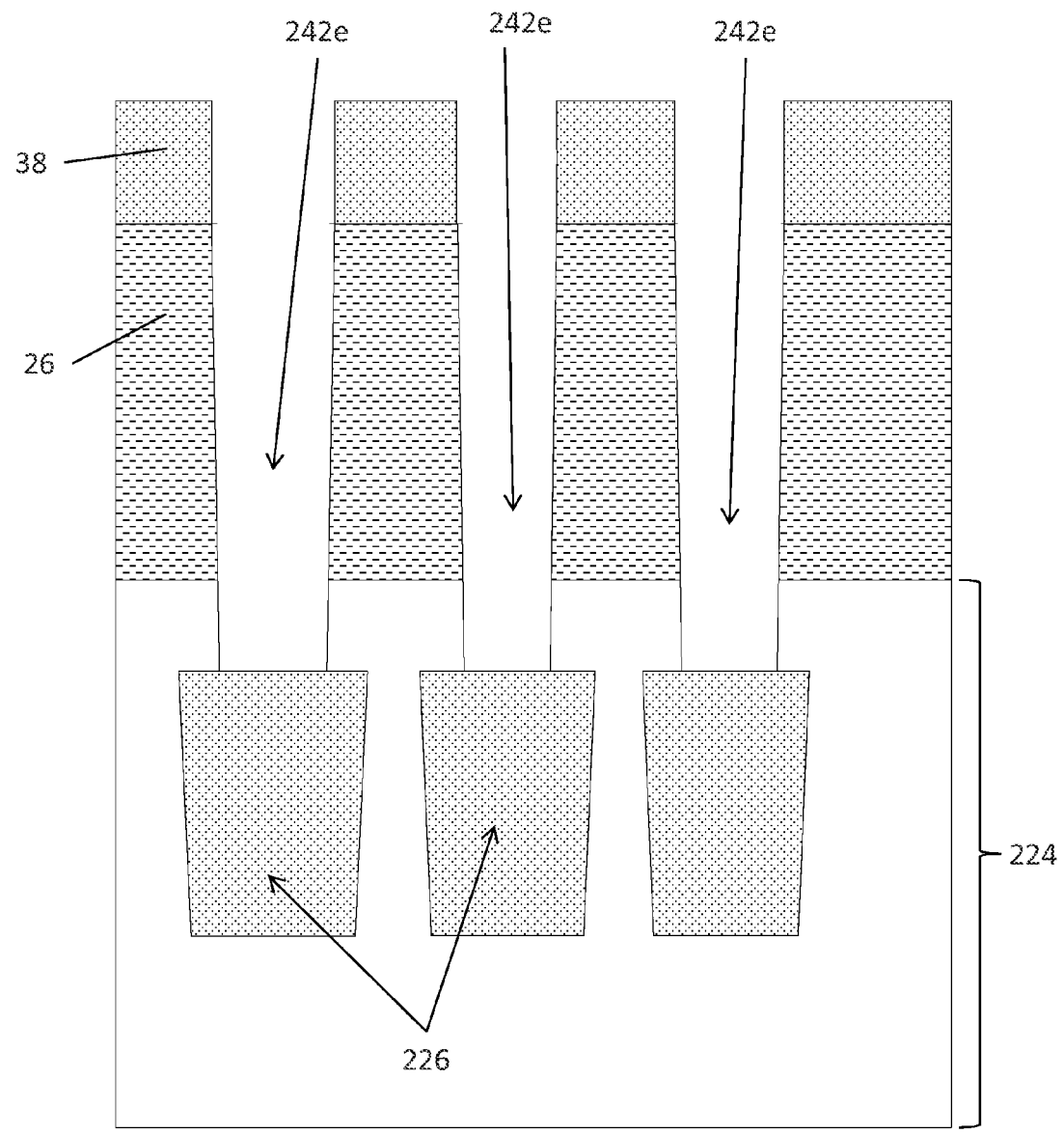

The spacers 260 are then removed to form openings 242e aligned with the trench regions 242d. The trench regions 242d are then filled with an insulating material 226. The material 226 may, for example, comprise an oxide material such as silicon oxide. The filling of the trench regions 242d with the oxide material 226 may be accomplished using a thermal oxide growth as known to those skilled in the art. The result of the fill operation is shown in FIG. 7G. It will be understood, although not explicitly shown in FIG. 7G, that the material 226 filling the trench regions 242d may preferably overfill into the openings 242e.

Figure 7H:
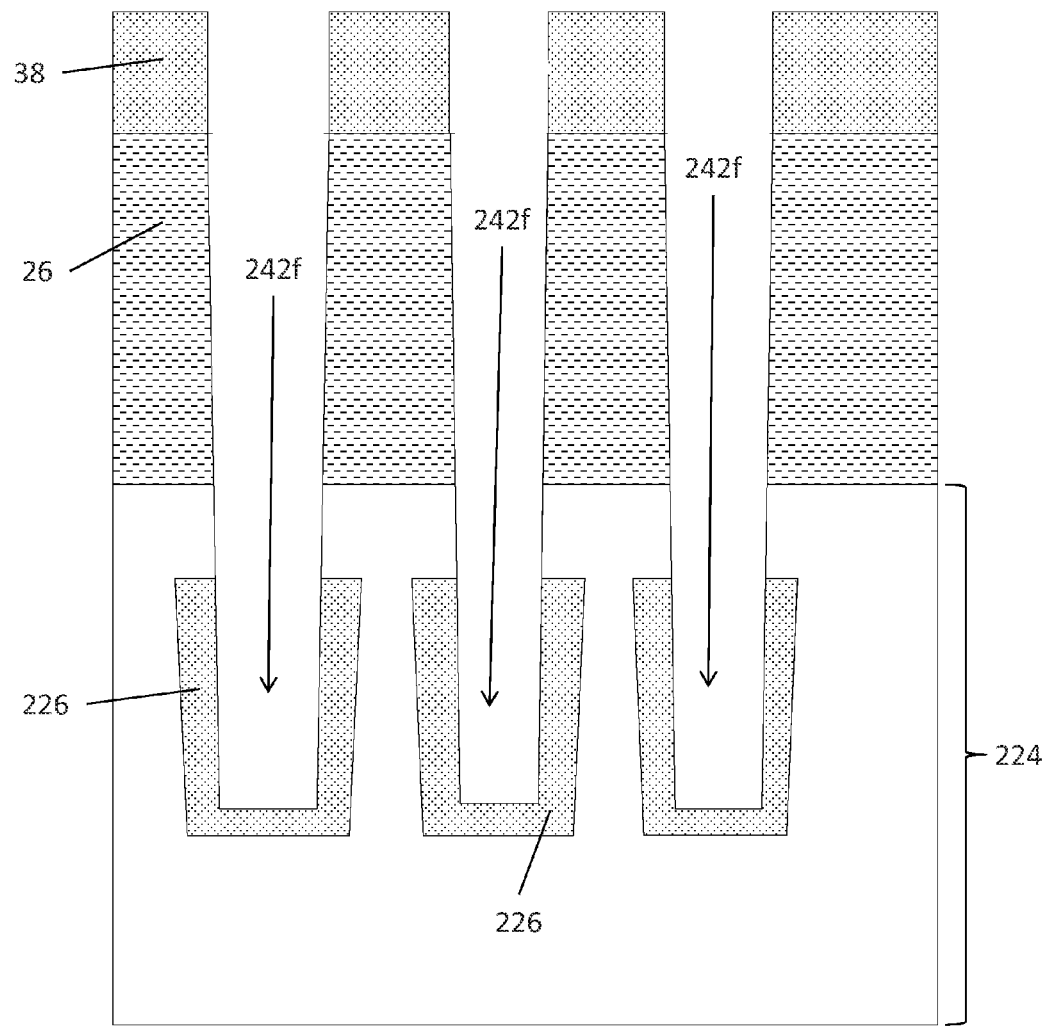

A highly directional etch (as known in the art) which preferentially removes the oxide insulating material 226 is then performed to form trench openings 242f in the oxide insulating material 226. The result of the etch is shown in FIG. 7H.

Figure 7I:
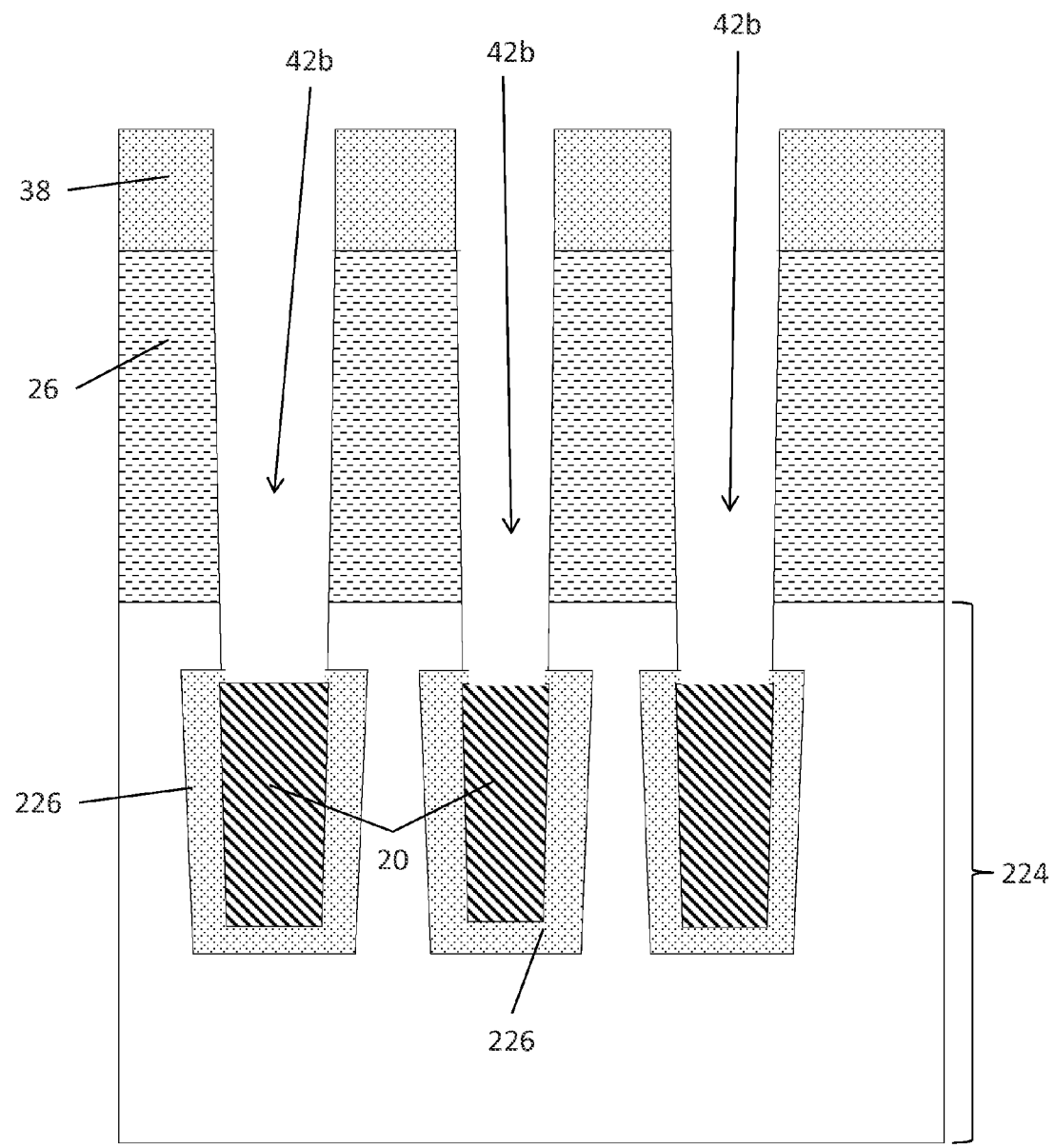

The openings 242f are then filled with a metal conductor material. As an example, the metal conductor material may comprise Tungsten (W). The fill operation may be performed using a chemical vapor deposition (CVD), as known in the art. The result of this deposition will produce metal material covering the mask 38. A chemical-mechanical polishing (CMP) operation is performed to remove the metal down to the level of the mask 38. An etch which is selective to remove the metal material, such as a $BCl_3$ plasma etch, as known in the art, is then performed to recess the deposited metal material in the openings 242f to produce the source-drain contacts 20. The recess process removes the metal material down to a level at or below the location of the filled trenches and leaves openings 42b. The result of the fill, polish and etch process is shown in FIG. 7I.

At this point, the fabrication process continues with FIGS. 2E to 2M so as to produce the integrated circuit shown in FIG. 6. The fabrication process steps of FIG. 2E-2M are incorporated by reference to follow the fabrication process steps of FIGS. 7A-7I.

The foregoing description has provided by way of exemplary and non-limiting examples a full and informative description of one or more exemplary embodiments of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. An integrated circuit transistor, comprising:
   a substrate including a semiconductor region and a trench having side walls and a bottom;
   a metal material at least partially filling the trench and insulated from the semiconductor region along the side walls and bottom of the trench to form a source contact buried in the substrate;
   a source region in the substrate in electrical connection with a top surface of the metal material for the source contact;
   a channel region in the substrate adjacent the source region;
   a gate dielectric on top of the channel region; and
   a gate electrode on top of the gate dielectric.

2. The transistor of claim 1, wherein the substrate comprises a silicon on insulator (SOI) substrate including an insulator layer between a base substrate layer and a semiconductor layer, wherein the source region and channel region are located in the semiconductor layer, and wherein the trench extends into the insulator layer with the insulating layer insulating the sidewalls and bottom of the trench.

3. The transistor of claim 2, wherein the semiconductor layer of the substrate includes plurality of fins, each fin including said source region and channel region.

4. The transistor of claim 2, further comprising a conductive junction provided at a same level as the semiconductor layer to electrically connect the top surface of the metal material for the buried source contact with a side of the source region.

5. The transistor of claim 4, further comprising a silicide region between the top surface of the metal material for the buried source contact and a bottom of the conductive junction.

6. The transistor of claim 1, wherein the substrate comprises a bulk substrate including first semiconductor layer between a base substrate layer and a second semiconductor layer, wherein the source region and channel region are located in the second semiconductor layer, and wherein the trench extends into the first semiconductor layer.

7. The transistor of claim 6, wherein the second semiconductor layer of the substrate includes plurality of fins, each fin including said source region and channel region.

8. The transistor of claim 6, wherein the trench includes an insulating layer insulating the metal material of the source contact at the side walls and bottom of the trench from the first semiconductor layer.

9. The transistor of claim 6, further comprising a conductive junction provided at a same level as the second semiconductor layer to electrically connect the top surface of the metal material for the buried source contact with a side of the source region.

10. The transistor of claim 9, further comprising a silicide region between the top surface of the metal material for the buried source contact and a bottom of the conductive junction.

11. The transistor of claim 1, wherein the substrate comprises a bulk substrate of semiconductor material, wherein the source region and channel region are located in a top portion of the bulk substrate, and wherein the trench extends into the bulk substrate to a depth below the top portion.

12. The transistor of claim 11, wherein the top portion of the bulk substrate includes plurality of fins, each fin including said source region and channel region.

13. The transistor of claim 11, wherein the trench includes an insulating layer insulating the metal material of the source contact at the side walls and bottom of the trench from the bulk substrate.

14. The transistor of claim 11, further comprising a conductive junction provided at a same level as the top portion to electrically connect the top surface of the metal material for the buried source contact with a side of the source region.

15. The transistor of claim 14, further comprising a silicide region between the top surface of the metal material for the buried source contact and a bottom of the conductive junction.

16. The transistor of claim 1, further comprising a gate contact extending from above the gate electrode to make electrical contact with the gate electrode, said gate contact laterally extending over the source region.

17. The transistor of claim 16, further comprising:
a premetal dielectric region over the substrate within which the gate contact is located; and
a via extending through said premetal dielectric region to make electrical contact with said buried source contact.

18. The transistor of claim 1, further comprising a fin including said source region and channel region.

19. The transistor of claim 1, further comprising a conductive junction provided to electrically connect the top surface of the metal material for the buried source contact with a side of the source region.

20. The transistor of claim 19, further comprising a silicide region between the top surface of the metal material for the buried source contact and a bottom of the conductive junction.

21. The transistor of claim 1, further comprising an insulating layer of material separating the metal material of the source contact from semiconductor region of the substrate.

22. The transistor of claim 1, wherein the source region and channel region are located in a top portion of the substrate, and wherein the trench extends into the substrate to a depth below a bottom of the source region and channel region.

23. The transistor of claim 22, further comprising a conductive junction provided at a same level as the source region to electrically connect the top surface of the metal material for the buried source contact with a side of the source region.

24. The transistor of claim 23, further comprising a silicide region between the top surface of the metal material for the buried source contact and a bottom of the conductive junction.

25. An integrated circuit transistor, comprising:
a region of semiconductor material including a source region, a drain region and a channel region between the source region and drain region;
an insulating layer supporting said region of semiconductor material, said insulating layer including a trench extending to a depth below a bottom of said source region;
a metal material at least partially filling the trench to form a source contact buried in said insulating layer, said source contact having sidewalls and a bottom insulated by said insulating layer;
a conductive junction positioned to electrically connect a top of the buried source contact with the source region;
a gate dielectric on top of the channel region; and
a gate electrode on top of the gate dielectric.

26. The transistor of claim 25, wherein the region of semiconductor material is an upper semiconductor layer of a silicon on insulator (SOI) substrate.

27. The transistor of claim 25, further comprising a silicide region between the top of the buried source contact and a bottom of the conductive junction.

28. The transistor of claim 25, wherein the source region, drain region and channel region are defined in a fin.

29. The transistor of claim 25, further comprising a gate contact extending from above the gate electrode to make electrical contact with the gate electrode.

30. The transistor of claim 29, further comprising:
a premetal dielectric region within which the gate contact is located; and
a via extending through said premetal dielectric region to make electrical contact with said buried source contact.

31. An integrated circuit transistor, comprising:
a region of semiconductor material including a source region and a channel region adjacent the source region;
a substrate layer supporting said region of semiconductor material, said substrate layer including a trench extending into and terminating within said substrate layer to a depth below a bottom of said source region;
a metal material at least partially filling the trench to form a buried source contact;
a conductive junction positioned at a same level as the source regions to electrically connect a top of the buried source contact with a side of said source region; and a gate dielectric on top of the channel region; and a gate electrode on top of the gate dielectric.

32. The transistor of claim 31, further comprising a silicide region between the top of the buried source contact and a bottom of the conductive junction.

33. The transistor of claim 31, wherein the source region and channel region are defined in a fin.

34. The transistor of claim 31, further comprising: a premetal dielectric region; and
a via extending through said premetal dielectric region to make electrical contact with said buried source contact.

35. The transistor of claim 31, wherein the region of semiconductor material is an upper semiconductor layer of a silicon on insulator (SOI) substrate.

36. The transistor of claim 31, further comprising an insulating material separating the metal material of the source contact from a conductive portion of the substrate layer.

* * * * *